US008839057B2

(12) United States Patent
Hughes

(10) Patent No.: US 8,839,057 B2
(45) Date of Patent: Sep. 16, 2014

(54) INTEGRATED CIRCUIT AND METHOD FOR TESTING MEMORY ON THE INTEGRATED CIRCUIT

(75) Inventor: Paul Stanley Hughes, Cambridge (GB)

(73) Assignee: ARM Limited, Cambridge (GB)

( * ) Notice: Subject to any disclaimer, the term of this patent is extended or adjusted under 35 U.S.C. 154(b) by 482 days.

(21) Appl. No.: 12/929,616

(22) Filed: Feb. 3, 2011

(65) Prior Publication Data

US 2012/0204069 A1  Aug. 9, 2012

(51) Int. Cl.

| G11C 29/00 | (2006.01) |
|---|---|
| G01R 31/28 | (2006.01) |
| G11C 29/16 | (2006.01) |
| G11C 29/04 | (2006.01) |
| G11C 29/26 | (2006.01) |

(52) U.S. Cl.
CPC ........ G11C 29/16 (2013.01); G11C 2029/0401 (2013.01); G11C 2029/2602 (2013.01)
USPC ............ 714/718; 714/719; 714/723; 714/730

(58) Field of Classification Search
USPC ................................. 714/718, 719, 723, 730
See application file for complete search history.

(56) References Cited

U.S. PATENT DOCUMENTS

| 4,969,148 | A | | 11/1990 | Nadeau-Dostie et al. | |
|---|---|---|---|---|---|
| 5,423,050 | A | * | 6/1995 | Taylor et al. ..................... | 714/31 |
| 5,617,421 | A | * | 4/1997 | Chin et al. .................... | 370/402 |
| 6,073,263 | A | * | 6/2000 | Arkin et al. .................... | 714/738 |
| 6,191,603 | B1 | | 2/2001 | Muradali et al. | |
| 6,314,034 | B1 | * | 11/2001 | Sugamori ..................... | 365/201 |
| 6,320,812 | B1 | * | 11/2001 | Cook et al. ............... | 365/230.03 |
| 6,351,834 | B1 | * | 2/2002 | Maekawa et al. ............. | 714/718 |
| 6,480,978 | B1 | * | 11/2002 | Roy et al. ....................... | 714/724 |
| 6,631,340 | B2 | * | 10/2003 | Sugamori et al. .............. | 702/122 |
| 6,651,204 | B1 | * | 11/2003 | Rajsuman et al. ............. | 714/738 |
| 6,944,617 | B2 | * | 9/2005 | Harriman ...................... | 709/230 |
| 6,996,757 | B2 | * | 2/2006 | Evans ........................... | 714/724 |
| 7,136,771 | B2 | * | 11/2006 | Terauchi ....................... | 702/117 |
| 7,142,003 | B2 | * | 11/2006 | Kanbayashi et al. ..... | 324/750.01 |
| 7,174,490 | B2 | * | 2/2007 | Evans ........................... | 714/724 |
| 7,184,917 | B2 | * | 2/2007 | Pramanick et al. ........... | 702/120 |
| 7,210,087 | B2 | * | 4/2007 | Mukai et al. .................. | 714/742 |
| 7,246,277 | B2 | * | 7/2007 | Lukanc ......................... | 714/718 |

(Continued)

OTHER PUBLICATIONS

Bondoni et al., "An Effective Distributed BIST Architecture for RAMs", Proceedings of the IEEE European Test Workshop, ETW'00, 6 pages.

(Continued)

Primary Examiner — Joseph D Torres
(74) Attorney, Agent, or Firm — Nixon & Vanderhye P.C.

(57) ABSTRACT

An integrated circuit includes memory units and at least one memory test module, each module includes one associated memory unit, a set of test registers therefor, and a test engine configured to perform a test operation on that associated memory unit. A transaction interface of the memory test module receives a transaction specifying a register access operation and providing a first address portion having encodings allowing individual memory units as well as groups of memory units to be identified, and a second address portion identifying one of the test registers within the set to be an accessed register. Decode circuitry, within each memory test module and responsive to the transaction, is configured to selectively perform the register access operation if it is determined that the memory test module includes a set of test registers associated with a memory unit.

24 Claims, 12 Drawing Sheets

(56) References Cited

U.S. PATENT DOCUMENTS

| | | | |
|---|---|---|---|
| 7,278,079 B2* | 10/2007 | Evans | 714/740 |
| 7,290,192 B2* | 10/2007 | Ichiyoshi | 714/742 |
| 7,363,557 B2* | 4/2008 | Evans | 714/724 |
| 7,428,679 B2* | 9/2008 | Evans | 714/733 |
| 7,430,486 B2* | 9/2008 | Elston et al. | 702/108 |
| 7,437,261 B2* | 10/2008 | Pramanick et al. | 702/117 |
| 7,502,326 B2* | 3/2009 | Evans | 370/241 |
| 7,577,884 B2* | 8/2009 | Ogura et al. | 714/718 |
| 7,640,132 B2* | 12/2009 | Katagiri et al. | 702/123 |
| 7,657,807 B1* | 2/2010 | Watkins et al. | 714/727 |
| 7,802,140 B2* | 9/2010 | Iwamoto | 714/27 |
| 7,809,520 B2* | 10/2010 | Adachi | 702/119 |
| 7,836,372 B2* | 11/2010 | Bodrozic et al. | 714/743 |
| 7,904,765 B2* | 3/2011 | Hata et al. | 714/718 |
| 7,913,002 B2* | 3/2011 | Washizu et al. | 710/62 |
| 8,078,424 B2* | 12/2011 | Adachi | 702/120 |
| 8,082,541 B2* | 12/2011 | Pramanick et al. | 717/130 |
| 8,094,566 B2* | 1/2012 | Hiraide | 370/241 |
| 8,117,004 B2* | 2/2012 | Akhtar et al. | 702/120 |
| 8,145,965 B2* | 3/2012 | Nagatani et al. | 714/736 |
| 8,258,803 B2* | 9/2012 | Hiraide et al. | 324/750.3 |
| 2003/0074153 A1* | 4/2003 | Sugamori et al. | 702/122 |
| 2003/0193897 A1* | 10/2003 | Evans | 370/250 |
| 2003/0196139 A1* | 10/2003 | Evans | 714/25 |
| 2003/0196151 A1* | 10/2003 | Evans | 714/724 |
| 2003/0196153 A1* | 10/2003 | Evans | 714/742 |
| 2003/0208713 A1* | 11/2003 | Evans | 714/742 |
| 2004/0193990 A1* | 9/2004 | Ichiyoshi | 714/742 |
| 2004/0210798 A1* | 10/2004 | Higashi | 714/27 |
| 2004/0255216 A1* | 12/2004 | Ichiyoshi | 714/742 |
| 2005/0039079 A1* | 2/2005 | Higashi et al. | 714/28 |
| 2005/0149803 A1* | 7/2005 | Hirano et al. | 714/738 |
| 2005/0154550 A1* | 7/2005 | Singh et al. | 702/108 |
| 2005/0261855 A1* | 11/2005 | Adachi et al. | 702/108 |
| 2005/0262412 A1* | 11/2005 | Mukai et al. | 714/742 |
| 2005/0262414 A1* | 11/2005 | Elston et al. | 714/746 |
| 2008/0016396 A1* | 1/2008 | Higashi et al. | 714/30 |
| 2008/0235550 A1* | 9/2008 | Yamada et al. | 714/738 |
| 2011/0057673 A1* | 3/2011 | Iwamoto et al. | 324/750.3 |

OTHER PUBLICATIONS

U.S. Appl. No. 11/270,818, Aitken et al., filed Nov. 10, 2005.

\* cited by examiner

| Memory ID | M1 | M2 | M3 | M4 | M5 | 500 |
|---|---|---|---|---|---|---|
| Group IDs | G1,G2 | G1,G2 | G1,G3 | G1,G3 | G1,G3 | 505 |

| | | | | | M1 | M2 | M3 | M4 | M5 |
|---|---|---|---|---|---|---|---|---|---|
| M | G1 | Instruction Register | W | {W0 R0 W1 R1} | | | | | |
| M | G1 | Command Register | W | Run | Passed | Passed | Passed | Passed | Failed |

Read back overall result
525        530

| | | | | | M1 | M2 | M3 | M4 | M5 |
|---|---|---|---|---|---|---|---|---|---|
| M | G1 | Status Register | R | Failed | Passed | Passed | Passed | Passed | Failed |

FIG. 7C

Read back result for each static group
535        540

| | | | | | M1 | M2 | M3 | M4 | M5 |
|---|---|---|---|---|---|---|---|---|---|
| M | G2 | Status Register | R | Passed | Passed | Passed | | | |
| M | G3 | Status Register | R | Failed | | | Passed | Passed | Failed |

From experience, M5 is known to be problematic and therefore the most likely source of the failure in G3. To test this theory, set the programmable group to include M3 and M4 (G3 - M5)  557

✗ = Member of programmable group
✓ = Not member of programmable group

555

| | | | | | M1 | M2 | M3 | M4 | M5 |
|---|---|---|---|---|---|---|---|---|---|
| | | | | | ? | ? | ? | ? | ? |
| M | G1 | Programmable Group | W | 0 | ✗ | ✗ | ✗ | ✗ | ✗ |
| M | G3 | Programmable Group | W | 1 | ✗ | ✗ | ✓ | ✓ | ✓ |
| U | M5 | Programmable Group | W | 0 | ✗ | ✗ | ✓ | ✓ | ✗ |

560 565        FIG. 7E        567 562

Read back result for the programmable group
570        575

| | | | | | M1 | M2 | M3 | M4 | M5 |
|---|---|---|---|---|---|---|---|---|---|
| M | G program | Status Register | R | Passed | | | Passed | Passed | |

FIG. 7F

INTEGRATED CIRCUIT AND METHOD FOR TESTING MEMORY ON THE INTEGRATED CIRCUIT

BACKGROUND OF THE INVENTION

1. Field of the Invention

The present invention relates to an integrated circuit and method for testing memory on the integrated circuit.

2. Description of the Prior Art

It is becoming more and more common for integrated circuits to include embedded memory to allow rapid access to data by functional circuits provided on the integrated circuit. Whilst an integrated circuit may traditionally comprise a number of circuit components formed on a single die, it may also consist of circuit components distributed across multiple dies that are integrated together in a package using 3D integration technologies such as multi-chip modules, system in package, or through-silicon-vias.

As the use of embedded memory continues to increase, thorough testing and defect diagnosis has become a key requirement to ensure product quality and enhance product yield. Whilst embedded memory presents significant system performance and cost reduction advantages, it brings its own testing issues. Externally generated test vector style tests are not suitable for verifying embedded memory arrays for a number of reasons. Firstly, the time spent in the manufacturing test grows exponentially as the embedded memory die area increases, which often makes such test vector style testing too costly. Furthermore, it is sometimes not possible to create a set of vectors that can detect all possible types of memory defect.

A known technique which alleviates such problems is to provide the integrated circuit with a memory Built In Self-Test (BIST) mechanism. In simplistic terms, a memory BIST (MBIST) mechanism is an on-chip utility that enables the execution of a proven set of algorithmic style verification tests directly on the embedded memory. These tests can be executed at the design's full operating frequency to prove the memory operations and identify errors caused by silicon defects.

In accordance with one known technique, a separate BIST mechanism is provided for each embedded memory within the integrated circuit. However, as the number of memory circuits provided within the integrated circuit increases, such an approach results in the chip area devoted to testing becoming unacceptably large. Hence, techniques have been developed which enable the BIST mechanism to be shared amongst several embedded memories within the integrated circuit. One such technique is described in U.S. Pat. No. 4,969,148, where, as for example shown in FIGS. 6 and 7 of that document, a single MBIST mechanism is shared between a number of embedded RAM (Random Access Memory) blocks within the integrated circuit. As can be seen from those figures, this technique involves providing a two-input multiplexer assembly in association with the data in port of each RAM block.

In the example of FIG. 6 of U.S. Pat. No. 4,969,148, the RAM blocks are connected in a daisy chain arrangement, such that the data input line of RAM 1 is connected to the serial data out port of the MBIST mechanism, the data output line of RAM 1 is connected to the data input line of RAM 2, the data output line of RAM 2 is connected to the data input line of RAM 3 and the data output line of RAM 3 is connected to the serial data in port of the MBIST mechanism. When in the test mode, the MBIST mechanism can operate at the system clock speed and serially shifts test bits from its serial data out port through the sequence of RAM blocks via the associated multiplexer assemblies, with the output from the last RAM block being returned to the serial data in port of the MBIST mechanism. During this test process, the same address is provided to each of the RAM blocks in parallel. This arrangement for sharing the test circuitry simplifies the testing procedure since the three memories are treated as if they were one large memory. In accordance with an alternative embodiment shown in FIG. 7 of U.S. Pat. No. 4,969,148, a RAM select counter and associated "1 of 3" multiplexer is used to provide an arrangement where only one of the memories is tested at a time.

U.S. Pat. No. 6,191,603 describes a modular embedded test system for use in integrated circuits. In accordance with this technique, a number of core modules are provided, and each core may possess BIST functions which can be activated using external commands. An access scan chain is provided for controlling tests performed on each core, and a separate data scan chain is provided to apply specific test vectors and observe their responses.

The article "An Effective Distributed BIST Architecture for RAMs" by M Bodoni et al, Proceedings of the IEEE European Test Workshop (ETW '00), describes a BIST architecture employing a single BIST processor used to test all the memories of the system, and a wrapper for each SRAM including standard memory BIST modules. The architecture employs a normal test scan chain (NTScan) and a results scan chain (Resscan), and commands for these two scan chains, along with synchronisation signals used to forward test primitives to the wrappers, are multiplexed within each wrapper to reduce routing overhead. March tests (or test algorithms) are applied one memory operation at a time, and as a result multiple operations cannot be applied at system clock speed.

As the number of memory units embedded within the integrated circuit increases, then this results in an increase in the complexity of the interface between those memory units and a shared BIST mechanism for those memory units. The known BIST mechanism sharing techniques become complex to manage as the number of memory units increase, and further lack flexibility with regard to the tests to be applied on each of the memory units.

Commonly owned co-pending U.S. patent application Ser. No. 11/270,818, the entire contents of which are hereby incorporated by reference, describes memory test circuitry which comprises a plurality of test wrapper units, each test wrapper unit being associated with a corresponding memory unit, and a test controller for controlling performance of a sequence of tests by communicating with each of the test wrapper units. Two different communication links are provided between the test controller and the test wrapper units. In particular, a first communication link connects each of the test wrapper units directly with the test controller, and allows first test data to be broadcast in parallel to all of the plurality of test wrapper units, the first communication link hence providing a very efficient mechanism for disseminating global test data required by each of the test wrapper units. Further, a second communication link is provided to connect each test wrapper unit in an ordered sequence with the test controller. The second communication link is used to output a sequence of blocks of second test data, where each block is received by one of the test wrapper units. Hence, device specific test data can be routed through the second communication link so as to allow each test wrapper unit to receive its own tailored test data.

Such an approach has been found to improve flexibility, since the use of both communication links provides flexibility in how the tests are set up for execution by each test wrapper unit. Further, the approach is readily scalable for increased numbers of memory units, allowing an arbitrary number of test wrapper units to be connected to a single controller.

However, such a memory BIST system, like most traditional memory BIST systems, is rigidly organised according to physical hierarchy or other physical constraints such as clock domains. This organisation naturally arises from attempts to reduce area and routing. The individual test wrapper units (also referred to herein as BIST modules) then need to be accessed according to this organisation. Accordingly, when developing test sequences to be executed, knowledge is required of the physical arrangement of the various test wrapper units so as to ensure that the correct test data is provided to the required test wrapper units.

Whilst the above mentioned U.S. patent application Ser. No. 11/270,818 allows certain registers within the separate test wrapper units to be written to in a broadcast mode via the first communication link, the use of this link is only appropriate when it is desired to target all of the test wrapper units in the system. In order to target individual test wrappers, the serial JTAG-style approach provided by the second communications link needs to be used. When using the second communications link, individual registers in each of the BIST wrapper units can be concatenated together into a single long shift register accessed via the second communications link. This long shift register can be shortened by putting some components into bypass, thereby replacing the relevant register of the bypassed wrapper unit with a single flip-flop. Whilst this can shorten the overall length of the long shift register formed by the concatenation of the individual registers, one command is required to bypass each BIST wrapper unit, and knowledge about the type of memory tested by each BIST wrapper unit must be maintained by the test equipment and the test program.

Further, if the overall result of the test is required using the above described mechanism, data would need to be shifted out from all of the relevant shift registers within the BIST wrapper units and aggregated by the test equipment and test program. If the result for a subset of memories is required using such a mechanism, data would be shifted out from all of the shift registers (possibly with unneeded data values bypassed) and then aggregated by the test equipment and test program based on information maintained by the test program about which memories are in the subset of memories of interest.

As a result, when using such prior art techniques, the test program needs to be written specifically for each integrated circuit, and if the integrated circuit changes, the test program must be recreated.

Accordingly, it would be desirable to provide an improved mechanism for testing memory units provided on an integrated circuit, which allows test programs to be developed without knowledge of the exact layout of the memory units within the integrated circuit.

SUMMARY OF THE INVENTION

Viewed from a first aspect, the present invention provides an integrated circuit comprising: a plurality of memory units; at least one memory test module, each memory test module having at least one associated memory unit from said plurality of memory units; each memory test module comprising: a set of test registers for each associated memory unit; a test engine configured, for each associated memory unit, to perform a test operation on that associated memory unit dependent on the status of the set of test registers provided for that associated memory unit; a transaction interface for receiving a transaction specifying a register access operation, the transaction providing a first address portion and a second address portion, the first address portion having encodings allowing individual memory units to be identified and groups of memory units to be identified, and the second address portion identifying one of the test registers within said set to be an accessed register for the register access operation; decode circuitry responsive to the transaction to selectively perform the register access operation by: (i) if an individual memory unit is identified by the first address portion, determining whether that individual memory unit is one of said at least one associated memory units and, if so, performing the register access operation on the accessed register within the set of test registers provided for that individual memory unit; (ii) if a group of memory units is identified by the first address portion, determining whether any of said at least one associated memory units is a memory unit within said group, and, if so, performing the register access operation on the accessed register within the set of test registers provided for each associated memory unit within said group.

In accordance with the present invention, each memory test module has a transaction interface for receiving a transaction specifying a register access operation. The transaction provides a first address portion that has encodings allowing individual memory units to be identified and groups of memory units to be identified. A second address portion of the transaction then identifies one of the test registers that is to be the accessed register for the register access operation. Decode circuitry within the memory test module then selectively performs the register access operation based on a determination as to whether it contains a set of test registers associated with either an individual memory unit identified by the transaction or a memory unit contained within a group of memory units identified by the transaction.

By utilising a transaction of this form, and providing each memory test module with decode circuitry that selectively performs the register access operation based on the above-described analysis of the transaction, the transaction can be written without needing to know where the memory unit or memory units that are the subject of the transaction actually reside relative to other memory units within the integrated circuit. The transaction then merely needs to be provided to each memory test module (or at least to each memory test module that could contain a targeted memory unit for the transaction), and the decode circuitry within each memory test module will then perform the access if required.

Such an approach hence provides a very simple programmer's view of the memory test system, allowing any transactions to be targeted at any individual memory unit, or at arbitrary combinations of memory units as defined by the memory groups. This hence avoids the problem with typical prior art techniques that results in a complex programmer's model based around variable length shift registers, the order of memory components in the scan chain, and many other factors.

In one embodiment, at least one of the test registers in the set of test registers is not a physical register, but instead is a virtual register which, when written to by a transaction, causes an action to take place. An example would be a command register which, when written to, causes the test engine to perform the test operation as defined by the content of an instruction register.

The first address portion can be arranged in a variety of ways, provided it provides encodings for both individual memory units and groups of memory units. In one embodiment, the first address portion comprises a type field and an identifier field, the type field identifying whether the transaction is a unicast transaction identifying an individual memory unit or a multicast transaction identifying a group of memory units, and the identifier field identifying the individual memory unit for a unicast transaction and identifying the group of memory units for a multicast transaction. This provides an efficient encoding, in one embodiment the type field merely taking the form of a single bit field to distinguish between unicast transactions and multicast transactions.

In one embodiment, the transaction includes a data field for providing data, and the transaction identifies whether the register access operation is a read operation or a write operation. If the register access operation is a write operation the decode circuitry causes the data provided in the data field to be written into the accessed register of each set of test registers for which the decode circuitry determines the register access operation is to be performed. Hence, by such an approach, the write data merely needs to be provided once within the transaction, and the decode circuitry ensures that the relevant registers to be written to are identified, and that the write data is then written into those registers.

In one embodiment, if the register access operation is a read operation, the decode circuitry causes to be output in the data field the data read from the accessed register of each set of test registers for which the decode circuitry determines the register access operation is to be performed. Hence, the data field can be populated with the read data as the read operation is performed.

In one embodiment, the integrated circuit further comprises merging circuitry, responsive to the transaction identifying one of said groups of memory units within the first address portion and the register access operation of that transaction being a read operation, to merge into the data field the data read from the accessed register within the set of test registers provided for each memory unit within the group. There are a number of types of read operation where such merging will be useful. For example, if the accessed register is a status register within the set of test registers, then the merging circuitry can operate to establish within the data field the cumulative status for the group of memory units. Hence, as an example, if the status register identifies whether a test has passed or failed, then as the read operation is performed in respect of the status register associated with each memory unit in the group, the contents of the data field are updated to reflect the overall status of those read status registers. Hence, if at the end of the read operation, all of the accessed status registers indicated that the test has passed, then the data field will identify a test pass. However, if one or more of the status registers indicate a test fail, then the data field will identify a test fail.

In one embodiment, the memory units forming each group of memory units are predefined. There are many ways in which the groups can be defined, for example based on manufacturer of the memory, size of the memory, memory compiler type, logical hierarchy, power down facilities, etc.

In one embodiment, at least one of the groups of memory units is programmable. This provides significant flexibility when performing testing. For example, if as a result of testing performed on particular predefined groups, it can be determined that a test fail condition is due to a failure in a memory unit in one particular predefined group, then the programmable group can be programmed to identify a predetermined subset of the memory units in that problematic predefined group with the aim of seeking to locate the exact memory unit giving rise to the error.

There are a number of ways of allowing at least one of the groups of memory units to be programmable. For example, in one embodiment, each said set of test registers includes a programmable group register that is programmable by one of said transactions specifying the programmable group register in the second address portion to be the accessed register for a write operation, such that the value stored in the programmable group register indicates whether the memory unit for which the corresponding set of test register is provided is within the programmable group of memory units or not. Hence, by such an approach, the earlier-described transactions can be used to program the relevant programmable group registers to identify the required group.

In one embodiment, the transaction used to program the programmable group register specifies in the first address portion either an individual memory unit or a group of memory units. It will be appreciated that by this approach, a number of transactions can be used to program the programmable group register. For example, a first transaction could program the programmable group registers based on a predefined group such that at that point the programmable group registers identify the same predefined group. A second transaction can then be used to clear the value in one or more of those programmable group registers so as to then specify as the programmable group a reduced number of memory units relative to the predefined group.

In one embodiment, multiple programmable groups may be provided. This can be achieved by either arranging each bit in a single programmable group register to represent a different programmable group, or by having multiple programmable group registers within each set of test registers, such that each separate programmable group register relates to a different programmable group.

In one embodiment, the integrated circuit further comprises a test controller for issuing the transaction, and a communication structure for distributing the transaction to the at least one memory test module.

Whilst there could be a single memory test module associated with all of the memory units, in one embodiment there are a plurality of memory test modules, each memory test module associated with a different subset of the plurality of memory units.

Considering embodiments comprising a plurality of test modules, the communication structure can take a variety of forms. In one embodiment, the communication structure comprises a ring bus connecting the test controller and each of the memory test modules in series, such that the transaction is routed sequentially through each memory test module.

In one embodiment using such a ring bus, each memory test module comprises merging circuitry, responsive to the transaction identifying one of said groups of memory units within the first address portion and the register access operation of that transaction being a read operation, to merge into existing data within the data field any data read from the accessed register within its at least one set of test registers. Hence, in such embodiments, merging circuitry within each memory test module can be used to merge the read data into existing read data within the data field as the transaction passes around the ring bus.

In one embodiment employing a ring bus, each memory test module employs a handshaking protocol to control propagation of the transaction around the ring bus. The handshaking protocol can take a variety of forms, for example a valid/ready protocol where a transmitting device issuing data (e.g. a transaction) asserts a valid signal with that data, and maintains the data until an asserted ready signal is received from the recipient indicating that the recipient was able to receive that data. By using such a handshaking protocol, it is possible to accelerate the onward propagation of the transaction, or at least part of the transaction, through the series of memory test modules. For example, if a transaction passing around the ring bus is seeking to read a particular status register, and within a particular memory test module a test is still in the process of being performed such that the status register is not yet available to be read, then the first and second address portions of that transaction can still be forwarded on by that memory test module to the next memory test module in the series even if the associated data portion cannot yet be transmitted. In that instance, the memory test module in question will de-assert its valid signal once the first and second address portions have been successfully transmitted onto the next memory test module in the series, and will not assert its valid signal again until the data portion is ready to transmit. Similarly, that memory test module could de-assert its ready signal if, due to the time taken to perform the test operation within the memory test module, it is unable to receive a next transaction seeking to be passed to it from a memory test module upstream of it.

As another example of where the use of the handshaking protocol can be useful, such a handshaking protocol will enable correct handling of transactions crossing clock domains, i.e. where one or more of the memory test modules resides in a different clock domain to one or more other of the memory test modules. In particular, clock domain crossing circuits can be interposed between memory test modules in different clock domains, with the valid and ready signals issued by those various memory test modules being used to synchronise the transfer of the transaction across the clock domain.

As an alternative to using a ring bus, the communication structure in an alternative embodiment may comprise a bus network via which the test controller is configured to broadcast the transaction in parallel to each of the memory test modules.

In one embodiment using such a bus network, each memory test module that has a plurality of sets of test registers comprises merging circuitry, responsive to the transaction identifying one of said groups of memory units within the first address portion and the register access operation of that transaction being a read operation, to merge the data read from the accessed register within multiple sets of test registers within that memory test module.

In addition, or alternatively, the bus network may include at least one merging circuitry, responsive to the transaction identifying one of said groups of memory units within the first address portion and the register access operation of that transaction being a read operation, to merge the data read from the accessed register within the set of test registers provided within multiple memory test modules. By such an approach, one or more merging circuits may be arranged in a hierarchical manner to merge the read data as it is returned through the bus network to the test controller.

The bus network may be a dedicated bus network provided for the test mode of operation. However, in one embodiment, the bus network is further used by functional circuitry used to access memory addresses during a mission mode of operation. Hence, in such embodiments, the same bus network is used during the mission mode of operation (i.e. a normal, non-test, mode of operation) to route data between functional circuits (for example a processor core, a DMA engine, an LCD controller, etc) accessing the memory units, and then is also used in the test mode of operation to enable communication between the test controller and the plurality of memory test modules.

In one particular embodiment, the bus network may be formed by an interconnect circuit.

In one embodiment, each transaction can be provided to every memory test module. However, in an alternative embodiment, the communication structure may include filtering circuitry for filtering the transactions so that the transaction is provided to only a subset of the memory test modules. In the example of a bus network used to distribute the transactions in parallel, such filtering circuitry may be provided at one or more hierarchical levels, similar to the earlier-described merging circuitry used to merge read data on its way back to the test controller (indeed in some embodiments the filtering and merging circuitry may be combined within the bus network). Based on knowledge of the memory test modules coupled to the filtering circuitry, the filtering circuitry may decide not to propagate on the transaction if it determines that those memory test modules are not associated with memory units to which the transaction is directed.

Similarly, when considering the ring bus implementation where the plurality of memory test modules are connected in series, the ring bus may be arranged as a number of sub-rings, with each sub-ring including one or more memory test modules and having an associated filtering circuit. The filtering circuit can then determine whether it is necessary to pass the transaction on to the one or more memory test modules in its associated sub-ring, or whether instead that sub-ring can be bypassed and the transaction passed on to the next sub-ring.

Viewed from a second aspect, the present invention provides an integrated circuit comprising: a plurality of memory unit means; at least one memory test means, each memory test means having at least one associated memory unit means from said plurality of memory unit means; each memory test means comprising: a set of test register means for each associated memory unit means; test means for performing, for each associated memory unit means, a test operation on that associated memory unit means dependent on the status of the set of test register means provided for that associated memory unit means; transaction interface means for receiving a transaction specifying a register access operation, the transaction providing a first address portion and a second address portion, the first address portion having encodings allowing individual memory unit means to be identified and groups of memory unit means to be identified, and the second address portion identifying one of the test register means within said set to be an accessed register means for the register access operation; decode means, responsive to the transaction, for selectively performing the register access operation by: (i) if an individual memory unit means is identified by the first address portion, determining whether that individual memory unit means is one of said at least one associated memory unit means and, if so, performing the register access operation on the accessed register means within the set of test register means provided for that individual memory unit means; (ii) if a group of memory unit means is identified by the first address portion, determining whether any of said at least one associated memory unit means is a memory unit means within said group, and, if so, performing the register access operation on the accessed register means within the set of test register means provided for each associated memory unit means within said group.

Viewed from a third aspect, the present invention provides a method of testing memory units within an integrated circuit comprising at least one memory test module, each memory test module having at least one associated memory unit from said plurality of memory units, and each memory test module comprising a set of test registers for each associated memory unit, the method comprising performing within each memory test module the steps of for each associated memory unit, performing a test operation on that associated memory unit dependent on the status of the set of test registers provided for that associated memory unit; receiving a transaction specifying a register access operation, the transaction providing a first address portion and a second address portion, the first address portion having encodings allowing individual memory units to be identified and groups of memory units to be identified, and the second address portion identifying one of the test registers within said set to be an accessed register for the register access operation; responsive to the transaction, selectively performing the register access operation by: (i) if an individual memory unit is identified by the first address portion, determining whether that individual memory unit is one of said at least one associated memory units and, if so, performing the register access operation pn the accessed register within the set of test registers provided for that individual memory unit; (ii) if a group of memory units is identified by the first address portion, determining whether any of said at least one associated memory units is a memory unit within said group, and, if so, performing the register access operation on the accessed register within the set of test registers provided for each associated memory unit within said group.

BRIEF DESCRIPTION OF THE DRAWINGS

The present invention will be described further, by way of example only, with reference to embodiments thereof as illustrated in the accompanying drawings, in which:

FIGS. 7A to 7F illustrate an example sequence of transactions that may take place in accordance with one embodiment;

DESCRIPTION OF EMBODIMENTS

Figure 1:
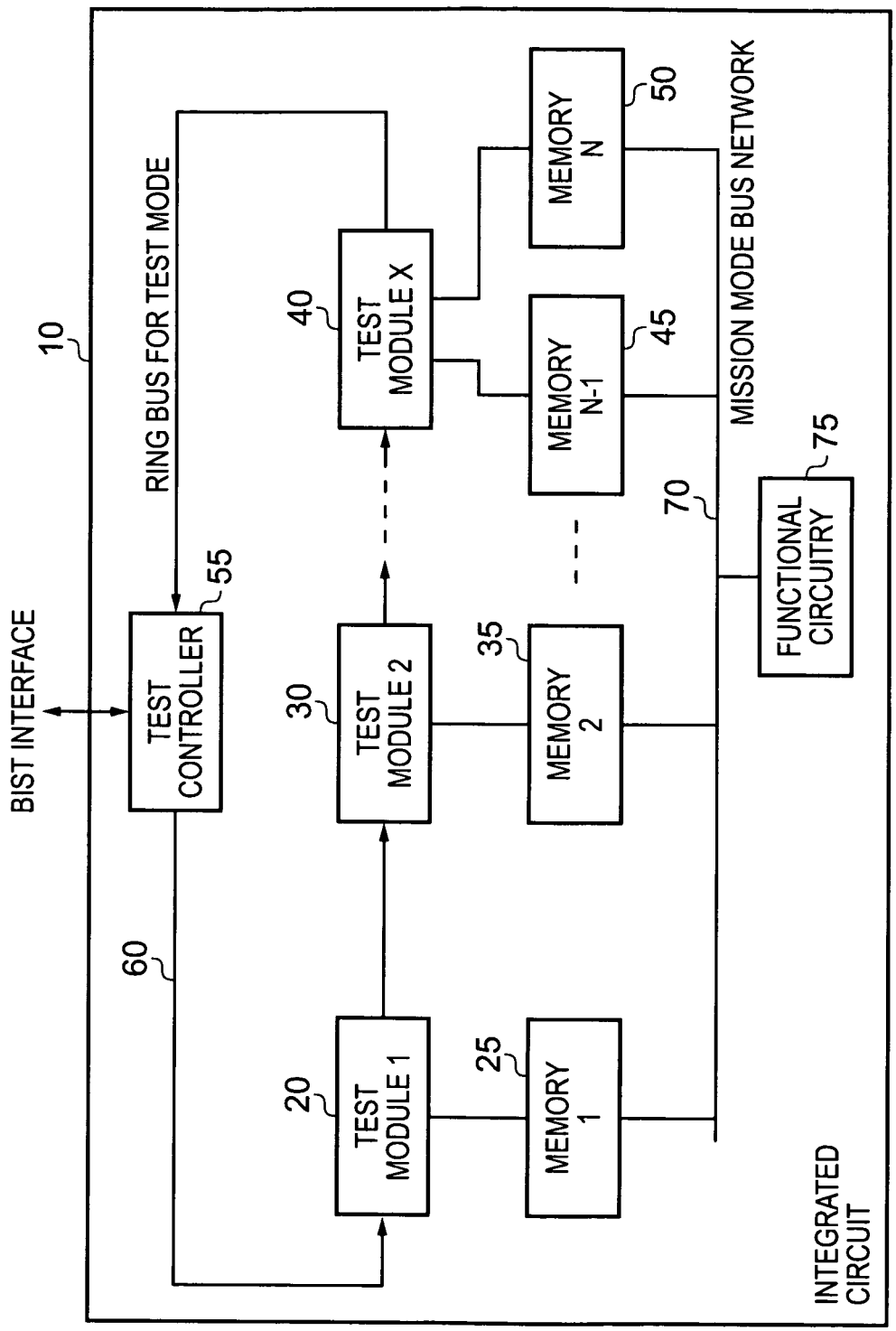
FIG. 1 is a block diagram of an integrated circuit in accordance with an embodiment.

FIG. 1 is a block diagram of an integrated circuit in accordance with one embodiment. The integrated circuit 10 comprises a plurality of embedded memory units 25, 35, 45, 50 which are used by a number of functional circuits (denoted in FIG. 1 as functional circuitry 75) during a normal mode of operation (also referred to herein as a mission mode). During the mission mode, the various functional circuits 75 will access the associated memory units 25, 35, 45, 50 via a bus network 70. The bus network can take a variety of forms as will be understood by those skilled in the art, but will allow each of the memory units to be accessed by one or more functional circuits during the mission mode of operation to enable read and/or write operations to take place in respect of those memory units.

As also shown in FIG. 1, a plurality of test modules 20, 30, 40 are provided for use during a test mode of operation to perform test operations in respect of the various memory units 25, 35, 45, 50. Whilst a separate memory test module may be provided for each memory unit, in one embodiment one or more of the test modules may be associated with multiple memory units. For example, the test module 40 may be associated with both the memory units 45, 50, and be used to perform test operations in respect of either or both of those memory units during the test mode of operation.

As shown in FIG. 1, the various test modules 20, 30, 40 are connected via a ring bus 60 with the test controller 55, which is coupled to a BIST interface of the integrated circuit 10.

As will be discussed in more detail below, the test controller 55 is arranged to issue a sequence of transactions over the ring bus during the test mode of operation, each transaction providing a first address portion that has encodings allowing individual memory units and groups of memory units to be identified. A second address portion of the transaction then identifies a particular test register that is to be accessed when processing the transaction. In particular, each test module will provide a set of test registers for each memory unit associated with that test module, and the second address portion will identify a particular test register within the set. Decode circuitry within the memory test module then selectively performs a register access operation specified by the transaction based on a determination as to whether its memory test module contains a set of test registers associated with either an individual memory unit identified by the transaction or a memory unit contained within a group of memory units identified by the transaction.

Figure 2:
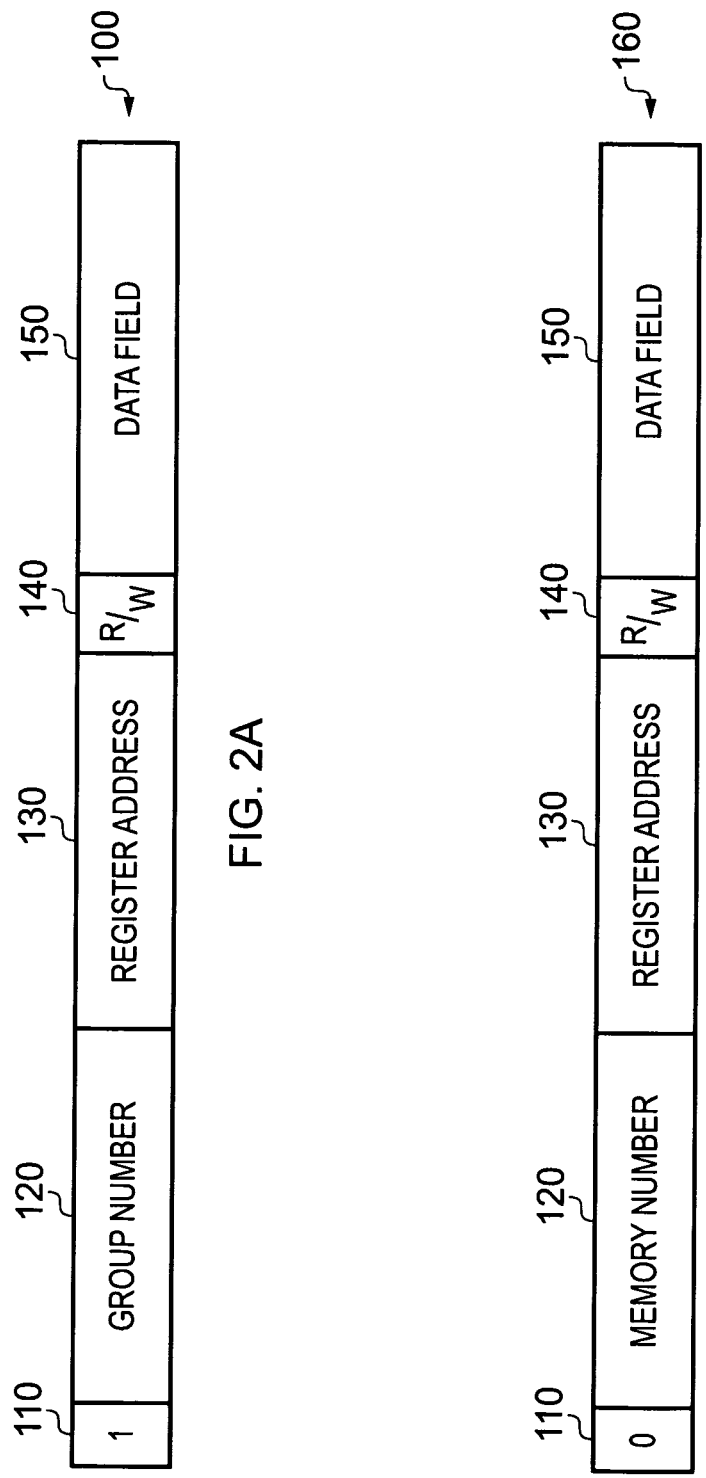
FIGS. 2A and 2B illustrate the format of transactions issued by the test controller in accordance with one embodiment.

FIGS. 2A and 2B illustrate the format of transaction use in accordance with one embodiment. In particular, in this embodiment the first address portion comprises a type field 110 and an identifier field 120, the type field 110 identifying whether the transaction is a unicast transaction identifying an individual memory unit or a multicast transaction identifying a group of memory units, and the identifier field identifying the individual memory unit for a unicast transaction and identifying the group of memory units for a multicast transaction. The transaction 100 illustrated in FIG. 2A is a multicast transaction, and in the illustrated embodiment the type field 110 is set to a logic one value to indicate that the transaction is a multicast transaction. Accordingly, the identifier field 120 identifies the group of memory units that is the subject of the transaction, in this embodiment this being done by specifying a group number. The transaction 160 of FIG. 2B illustrates the example of a unicast transaction, and in this embodiment the type field 110 is set to a logic zero value to indicate a unicast transaction, with the identifier field 120 then identifying the individual memory unit addressed by the transaction, in this example this being done by specifying a memory number.

For both unicast transactions and multicast transactions, the second address portion 130 identifies a particular test register within the set of test registers that is to be accessed, in this embodiment this being done by specifying a register address. A field 140 is then used to specify whether the transaction is a read transaction or a write transaction, with a data field 150 then providing the write data for a write transaction, or providing a field to be populated with the read data for a read transaction.

Figure 3:
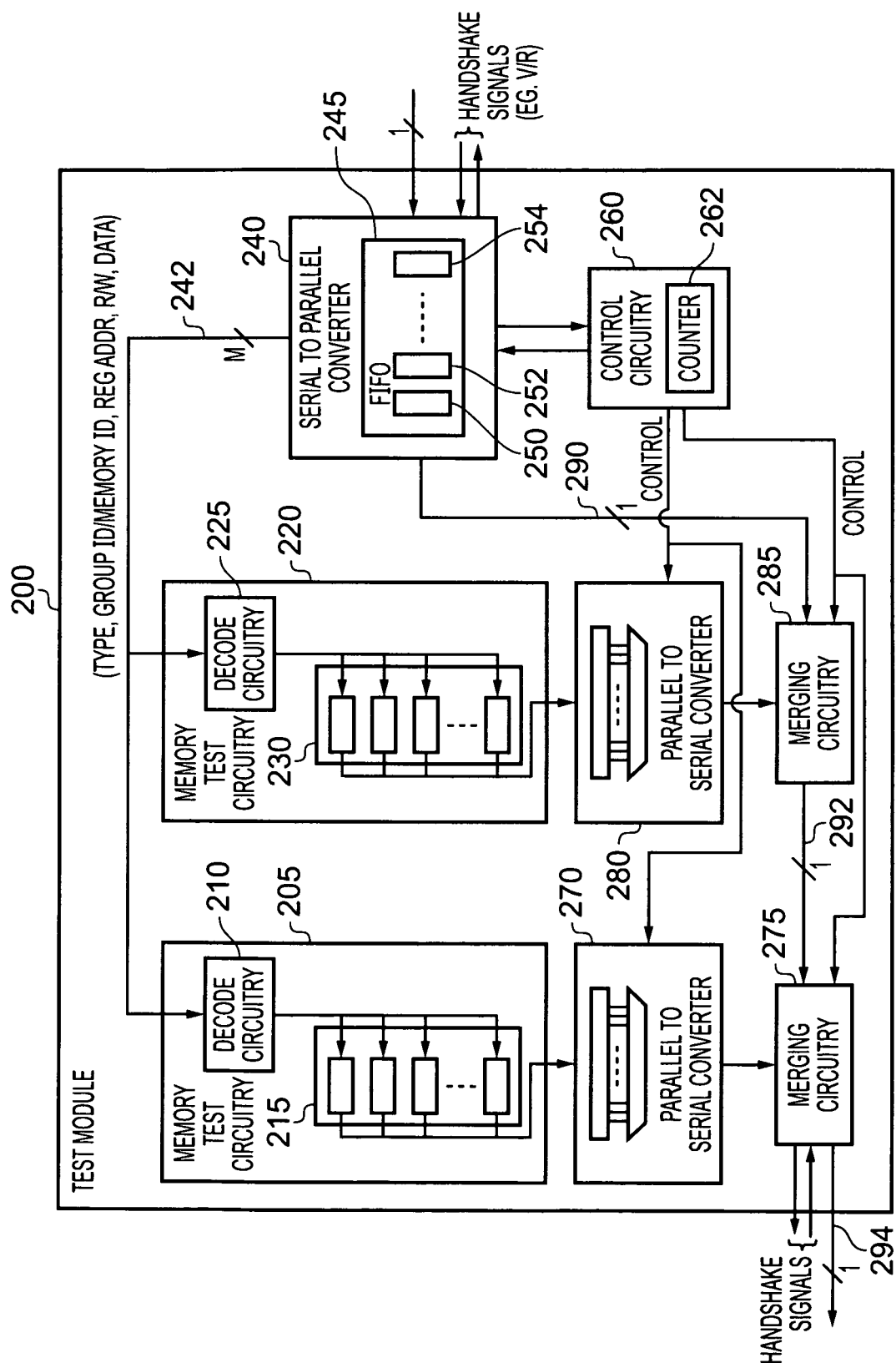
FIG. 3 is a block diagram illustrating in more detail the construction of a test module in accordance with one embodiment.

FIG. 3 is a block diagram of a test module that may be used within the integrated circuit of FIG. 1 in accordance with one embodiment. The test module 200 includes memory test circuitry 205, 220 for each memory unit associated with the test module, and accordingly in the example of FIG. 3 it is assumed that there are two memory units associated with the test module, as for example would be the case for the test module 40 of FIG. 1. Each memory test circuitry 205, 220 has associated parallel to serial converter circuitry 270, 280 and merging circuitry 275, 285. Accordingly, for a test module associated with only a single memory unit, the components 220, 280, 285 would be omitted, and similarly for a test module associated with more than two memory units, additional instances of the components 220, 280, 285 would be provided.

As is apparent from FIG. 1, each test module has an input interface coupled to a preceding test module in the ring (other than the first test module 20 whose input is connected to the output of the test controller 55), and has an output interface connected to the next test module in the ring (other than the last test module 40 whose output is connected to the test controller 55). Each transaction is issued by the test controller as a series of bits, these bits being received at the input interface of the test module by its serial to parallel converter 240. The serial to parallel converter 240 will typically comprise internal buffering storage for allowing the bits constituting at least one transaction to be buffered within the test module. In the example of FIG. 3, it is assumed that this buffering storage takes the form of a FIFO (first-in-first-out) storage 245 consisting of a plurality of storage elements 250, 252, 254 connected in series for storing the individual bits of the transaction.

Control circuitry 260 is used to control the operation of the serial to parallel converter 240 as well as other components within the test module, based on an understanding of where each transaction starts and ends. In one embodiment, each transaction comprises a fixed number of bits, and the control circuitry 260 uses a counter mechanism 262 to count the individual bits received by the serial to parallel converter, and accordingly determine the start of each transaction. In alternative embodiments, transactions could be arranged to be of variable length, with particular header formats being used to distinguish the start of each transaction.

In the example of FIG. 3, it is assumed that each transaction comprises M bits, and accordingly once a transaction has been buffered, the M bits of that transaction are muted over path 242 to each of the memory test circuits 205, 220, in particular the information routed over path 242 being received by decode circuitry 210, 225 within each memory test circuit 205, 220. As will be discussed in more detail later with reference to FIG. 4, the decode circuitry within each memory test circuit is aware of the memory number of the corresponding memory unit with which it is associated, as well as which group or groups of memory units that particular memory unit is contained within. Accordingly, based on the type field (multicast or unicast) and the group ID or memory ID provided over path 242, the decode circuitry 210, 225 can determine whether the transaction requires an access to be performed in respect of one of the test registers within that memory test circuit. If it does, then the register address of the transaction provided over path 242 is used to identify the particular test register within the test register set 215, 230, and for a write access the write data provided over path 242 from the transaction is written into that identified test register, whereas for a read transaction the contents of that register are output to the associated parallel to serial converter 270, 280.

As each field of the transaction is processed, the corresponding bits stored within the serial to parallel converter 240 can be piped out over paths 290, 292 to the output path 294. For write transactions, no modification to the transaction is required as it is passed from the serial to parallel converter 240 to the output path 294, and accordingly the merging circuits 285, 275 perform no function. Accordingly, in such instances, the control circuitry 260 would issue control signals to the merging circuits 285, 275 to cause the bits of the transaction to pass unchanged to the output 294. Similarly, control signals can be issued to the parallel to serial converters 270, 280 to disable their use whilst the write transaction is being processed. However, for a read transaction, the parallel to serial converters 270, 280 will be enabled by the control circuitry in order to convert the data read from an accessed register into a serial stream of bits for passing to the merging circuitry 275, 285, respectively. Further, as the data field bits 150 of the transaction are passed to each of the merging circuits 285, 275, the control circuit 260 will issue control signals to cause those merging circuits to merge into the current value stored in the data field the data obtained from the corresponding parallel to serial converter.

The merging circuits 285, 275 may also receive a signal from the respective decode circuits 225, 210, respectively, to control merging for a read transaction. Hence, for example, a valid signal could be issued by the decode circuits to their associated merging circuits, so that if a decode circuit determines, for a current read transaction, that a read is not required from a test register of its associated test register set, the valid signal will not be set and no merging will be performed by the associated merging circuit. Alternatively, if for example the merging circuit takes the form of a simple OR gate structure, the valid signal from the decode circuit could be sent to the associated parallel to serial converter, such that if the valid signal is not set, the parallel to serial converter merely outputs logic zero values irrespective of its input.

For a unicast transaction, such a merging operation will typically just cause the read data to be stored directly within the data field 150. However, for a multicast transaction, the merging operation will implement an update to the data held in the data field, such that the data field represents the accumulated data read from the various accessed registers associated with the memory units within the group. One example where this is useful is when performing a read with respect to a status register, with the merging circuitry then operating to establish within the data field the cumulative status for the group of memory units.

As illustrated in FIG. 3, the serial to parallel converter 240 may employ a handshaking protocol to control serial propagation of the transaction over the ring bus, in which case the final merging circuit 275 will also typically employ such a handshaking protocol. The handshaking protocol can take a variety of forms, for example a valid/ready protocol where a test module upstream of the test module 200 will assert a valid signal with the transaction data that it passes to the serial to parallel converter 240 and will maintain that transaction data until an asserted ready signal is received from the serial to parallel converter 240 indicating that the transaction data has been received into the FIFO 245. By using such a handshaking protocol, it is possible to accelerate the onward propagation of the transaction, or at least part of the transaction, through the series of memory test modules.

For example, if a transaction passing around the ring bus is seeking to read a particular status register, and within the memory test module 200 a test is still in the process of being performed such that the relevant status register within the memory test circuitry 205, 220 is not yet available to be read, then the first and second address portions of the transaction can still be forwarded on from the serial to parallel converter 240 over path 290, 292 to the output 294 so that the next memory test module downstream of the memory test module 200 can receive the address portion of the transaction even if the associated data portion cannot yet be transmitted. In that instance, the memory test module 200 will de-assert the valid signal that it propagates on from the merging circuitry 275 once the first and second address portions have been successfully transmitted onto the next memory test module in the series, and will not assert its valid signal again until the data portion is ready to transmit. Similarly, the test module 200 could de-assert its ready signal as issued from the serial to parallel converter 240 to the upstream test module if, due to the time taken to perform the test operation, it is unable to receive a next transaction seeking to be passed to it from the memory test module upstream of it.

As another example of where the use of the handshaking protocol can be useful, such a handshaking protocol will enable correct handling of transactions crossing clock domains, i.e. where one or more of the memory test modules resides in a different clock domain to one or more other of the memory test modules. In particular, clock domain crossing circuits can be interposed between memory test modules in different clock domains, with the valid and ready signals issued by those various memory test modules being used to synchronise the transfer of the transaction across the clock domain.

Figure 4:
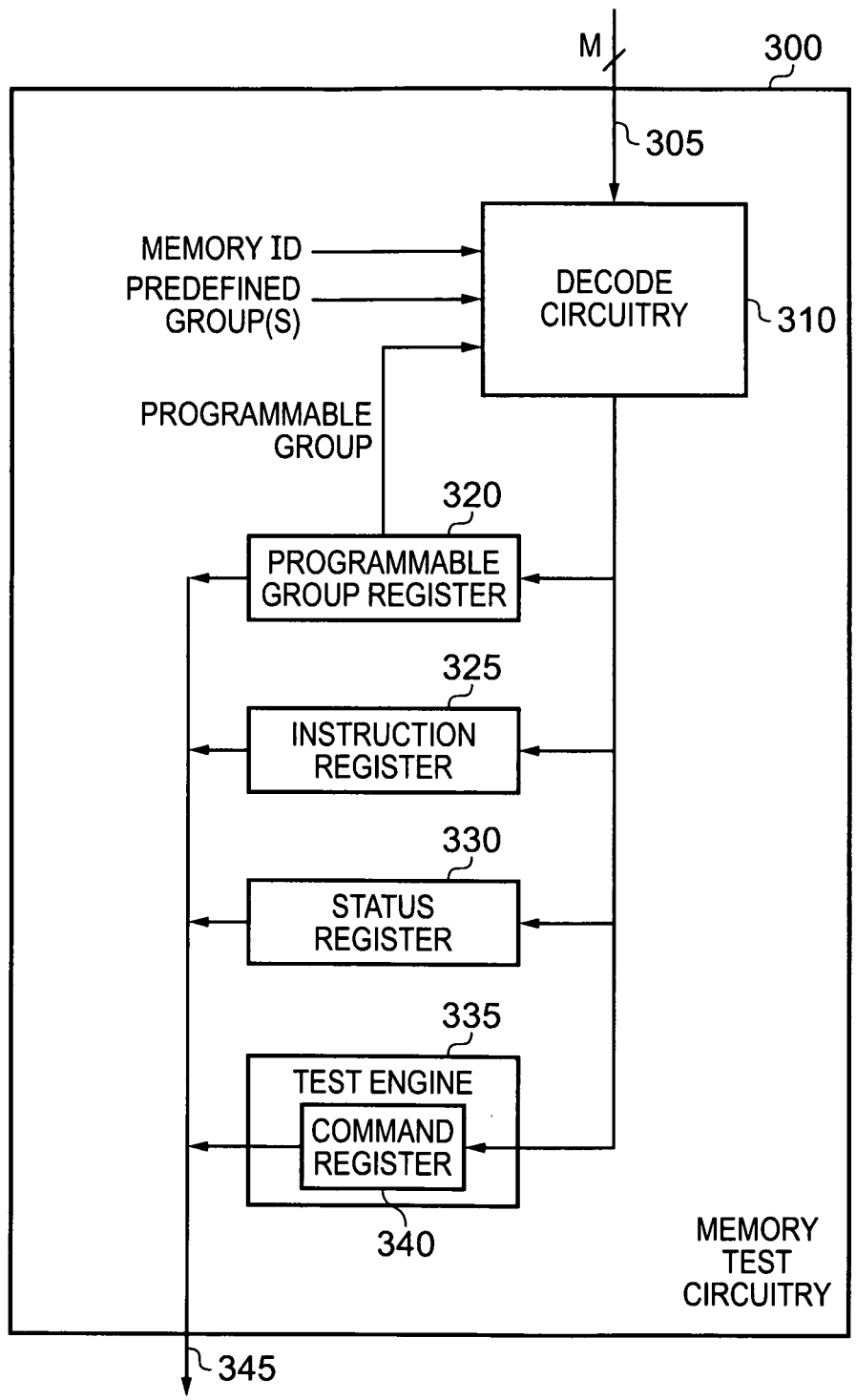
FIG. 4 is a diagram illustrating in more detail the memory test circuitry provided within each test module in accordance with one embodiment.

FIG. 4 is a diagram illustrating in more detail the memory test circuitry of one embodiment. As discussed earlier, there will be one or more instances of this memory test circuitry within each test module, depending on the number of memory units associated with that test module. As shown in FIG. 4, the decode circuitry 310 within the memory test circuitry 300 receives M bits identifying a current transaction. For a unicast transaction, the decode circuitry 310 will compare the memory ID specified by the transaction with the predefined memory ID for the associated memory unit in order to determine whether the unicast transaction needs processing by the memory test circuitry. Similarly, for a multicast transaction, the decode circuitry 310 will compare the group ID with one or more predefined group IDs corresponding to groups of which the associated memory unit is a member. In addition, in one embodiment, there may be at least one programmable group, with the contents of the programmable group register 320 identifying whether the memory unit associated with the memory test circuitry is within that group. In one embodiment, the programmable group register 320 can merely be a single bit register whose stored value indicates whether the memory unit associated with the memory test circuitry is part of the programmable group or not. However, in an alternative embodiment, multiple programmable groups may be provided. This can be achieved by either arranging each bit in a single multi-bit programmable group register to represent a different programmable group, or by having multiple programmable group registers within each set of test registers, such that each separate programmable group register relates to a different programmable group.

Where the decode circuitry 310 identifies for a unicast transaction that the associated memory unit is being accessed, or determines for a multicast transaction that the associated memory unit is part of a group being accessed, then the register address portion 130 of the transaction is referenced in order to determine which of the set of test registers 320, 325, 330, 340 is being accessed. For a write access, the write data specified in the data field 150 is then written into that addressed register, whereas for a read transaction the contents of that register are then read and output over path 345.

FIG. 4 illustrates various test registers that may be included within the set of test registers of each memory test circuitry. It will be appreciated that the indicated registers are just examples, and that in other embodiments alternative registers may be provided, or indeed various additional registers may be provided as part of the set of test registers. In addition to the programmable group register 320 discussed earlier, an instruction register 325 may be used for storing a sequence of bits identifying a memory test operation to be performed in respect of the associated memory unit. A status register 330 is provided for storing status information, for example indicating the result of the performance of a memory test operation. In addition, in the example of FIG. 4, a command register 340 is provided which, when written to, causes the test operation specified in the instruction register 325 to be performed in respect of the associated memory unit. In particular, when the command register 340 is written to, the test engine 335 is caused to implement the test specified in the instruction register 325. Whilst in one embodiment, the command register 340 may be a physical register, and hence may be written to, and if desired may be read from, in an alternative embodiment the command register 340 is merely a virtual register, with a write operation performed in respect of that command register causing the test engine 335 to perform the test operation specified by the contents of the instruction register 325. In such implementations, it will not be possible to perform a read operation in respect of the command register.

Whilst in FIG. 4 the test engine 325 is shown as being part of the memory test circuitry 300, in an alternative embodiment a single test engine 335 may be provided per test module 200, rather than per memory test circuitry 300. In such embodiments, whenever the decode circuitry 310 determines that a write operation is being performed in respect of the command register, it will issue a signal to the test engine to cause the test engine to perform a test operation based on the contents of the instruction register 325.

Figure 5:
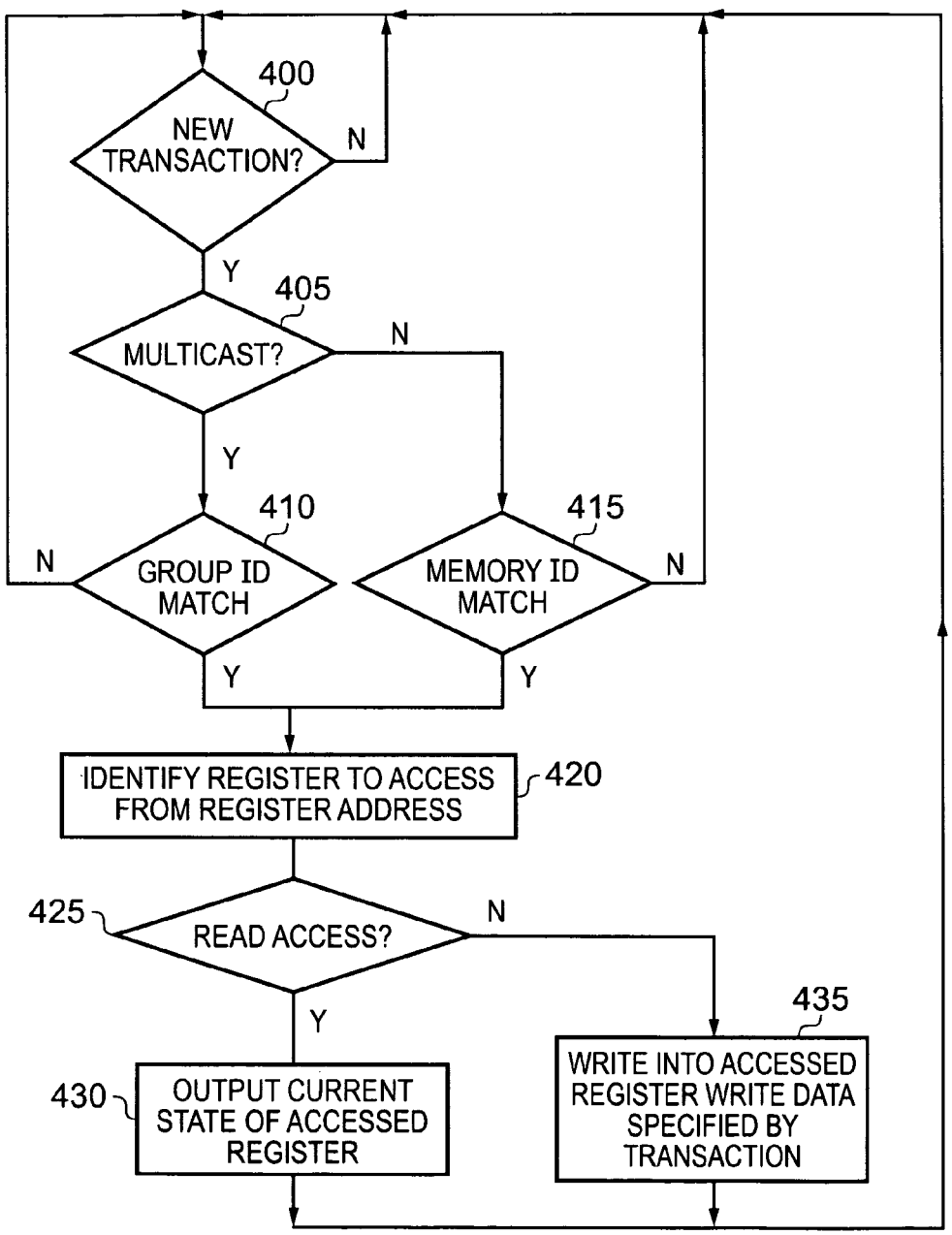
FIG. 5 is a flow diagram illustrating the operation of the memory test circuitry of FIG. 4 in accordance with one embodiment.

FIG. 5 is a flow diagram illustrating the operation of the memory test circuitry of FIG. 4. At step 400, a new transaction is awaited, and on receipt of a new transaction over path 305, the decode circuitry 310 determines at step 405 whether the transaction is a multicast transaction. If it is, then it is determined at step 410 whether the group ID specified in the transaction matches any predefined group or programmable group which the associated memory unit is a member of. If the group ID does not match either a predefined group or a programmable group, then the process returns to step 400. Similarly, if it is determined at step 405 that the transaction is not a multicast transaction, but is instead a unicast transaction, then it is determined at step 415 whether the memory ID specified in the transaction matches the memory ID of the associated memory unit, and if not the process returns to step 400.

However, if either a group ID match is detected at step 410 or a memory ID match is detected at step 415, then the process proceeds to step 420, where the decode circuitry 310 determines the register to access with reference to the register address portion 130 of the transaction. It is then determined at step 425 whether a read access is being performed by the transaction, and if so the current state of the accessed register is output over path 345 at step 430. However, if at step 425 it is determined that the access is not a read access, but is instead a write access, then the process proceeds to step 435 where the decode circuitry 310 causes the write data specified within the data field 150 of the transaction to be written into the accessed register. Following either step 430 or step 435, the process then returns to step 400.

Figure 6:
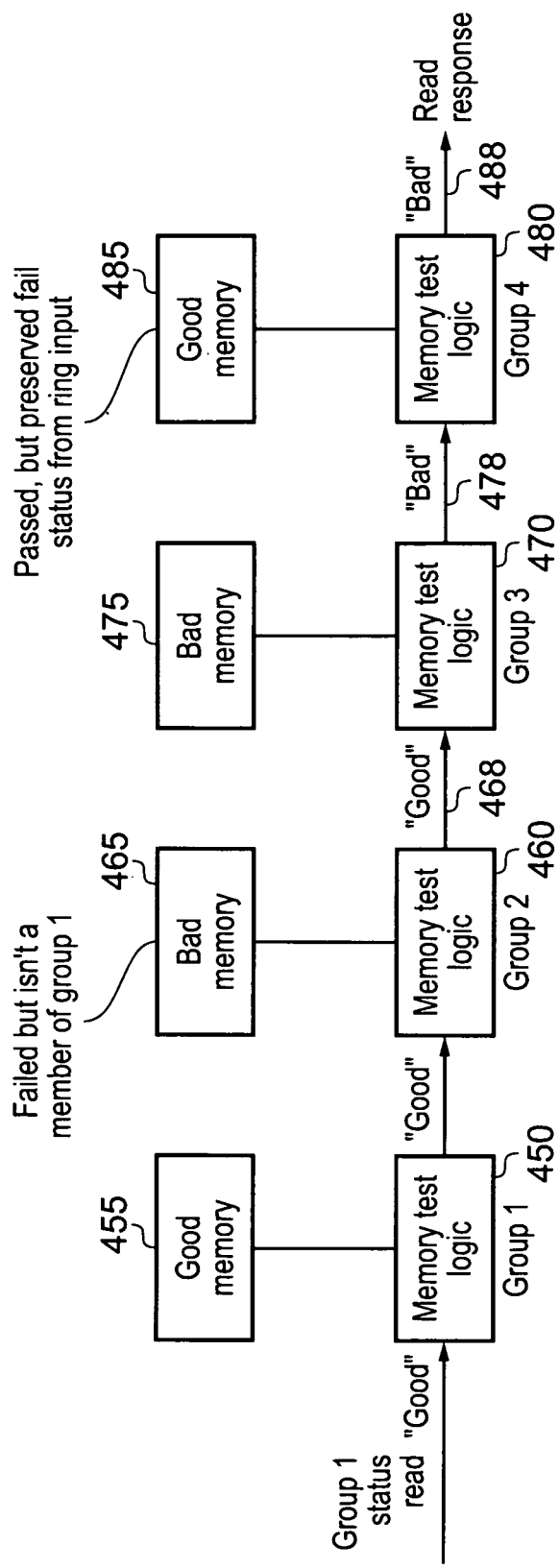
FIG. 6 is a diagram schematically illustrating how a status read transaction may be handled in respect of a particular group in accordance with one embodiment.

FIG. 6 illustrates how read transactions performed in respect of particular groups can be used to determine status information following performance of a test operation. In this example, it is assumed that it is desired to run a test operation on all memories in a chip. To do this, a "run test" command value is written to the command register 340 for a group that contains all of the memory units on the chip (and hence causes a write to take place in respect of every command register within each test module). This causes the test specified in the instruction register 325 to be performed.

Following the test, a read transaction is issued in respect of the same group, i.e. containing all of the memory units on the chip, the read transaction being directed to the status register 330. Assuming the status register stores a logic zero value to indicate that a test operation has passed, and stores a logic one value to indicate that the test operation has failed, then once this read transaction has been processed by all of the test modules, a logic zero value in the read data will indicate that the test has passed, whilst a logic one value will indicate that at least one memory unit failed the test.

It may then be desired to perform further investigation to find out what type of memory has failed. If we assume for the sake of argument that at the time the BIST circuitry was added to the chip, two groups were created, one containing all of the memory units by IP vendor A and another containing all of the memory units by IP vendor B, then it will be understood that further read transactions can be used to test the failed flags for each of these groups in order to determine whether vendor A, vendor B, or both vendors have failing memory units within the chip.

In FIG. 6, it is assumed that group 1 contains memory units by vendor A, whilst group 2 contains memory units by vendor B. A read transaction is issued in respect of group 1, to read the contents of the status register 330 associated with the memory units of group 1. As the read transaction passes around the ring, each test module determines if the read transaction is directed to a group for which its associated memory unit(s) is a member, and if it is it combines the output of its associated status register with the current contents of the data field 150. Assuming the earlier case where a logic zero value indicates a test pass and a logic one value indicates a test fail, it will be appreciated that such combining of the data can be achieved by performing a logical OR function in order to merge in the current status data with the previous contents of the data field provided at the input to the test module.

Accordingly, given the example of FIG. 6, it will be seen that the data field 150 as passed over the path 468 still indicates that the test has not failed, since although memory 465 is considered to be bad memory and failed its test, it is part of group 2, and accordingly the memory test module 460 will not have read the associated status register. However, the memory test module 470 will read the status register for memory unit 475 since memory unit 475 is part of group 1, and at this stage the data field 150 will be updated to identify that the test has failed, such that the data field passed over path 478 will identify that the test has failed. Even though memory unit 485 (which is also part of group 1) has passed the test, this does not affect the fact that the cumulative status maintained in the data field indicates that the test has failed in respect of the memory units of group 1, and accordingly the data field as passed over path 488 still indicates that the test has failed.

FIGS. 7A to 7F provides a detailed example of a sequence of transactions that can be performed in respect of the memory units of an integrated circuit in accordance with one embodiment. In this example, it is assumed that there are five memory units M1 to M5 having associated memory IDs 500. The memory test circuitry 300 associated with each memory unit is also provided with a number of group IDs 505 identifying groups for which the associated memory unit is a member. As shown in the example of FIG. 7A, in this example it is assumed that all of the memory units are part of group 1, memory units M1 and M2 are part of group 2 and memory units M3, M4 and M5 are part of group 3.

FIG. 7B then illustrates how two multicast transactions are used to perform a test operation. In particular, a first multicast transaction 510 identifies group 1 as the target for that transaction and identifies that the transaction requires a write access to be performed in respect of the instruction register. The data field then identifies the test sequence, in this example the test operation involving a write-read-write-read sequence to be performed in respect of the memory unit. In particular, this test sequence specifies that, for each memory address, a logic zero value should be written to and then read from that memory address, and then a logic one value should be written to and read from that memory address.

Since all of the memory units are within group 1, it will be understood from the earlier discussion that the processing of this multicast transaction 510 causes each instruction register 325 within every memory test circuit 300 to be written to in order to store data identifying the above mentioned test sequence. Thereafter, a second multicast transaction 515, again directed to group 1, causes a run test data value to be written into the command register 340. Again, since the multicast operation specifies group 1, this causes every command register to be written to, and accordingly causes the test operation to be performed in respect of every memory unit. The fields 520 indicate the status stored in the status register 330 of each memory unit following the performance of the test. In particular, in this example, it is assumed that memory units M1 to M4 all pass the test, but memory unit M5 fails the test.

FIG. 7C then indicates a further multicast transaction 525 that can be issued in order to read the status of the status registers. At this point, the transaction is again directed to group 1, so as to cause the data field 150 to be updated to reflect the cumulative status obtained as the transaction is processed by each test module. Because memory unit M5 failed the test, then it will be understood that following the performance of this transaction, the data field 150 will indicate the failed status 530.

Having determined that the overall test result is a fail condition, then it may be considered appropriate to read back the status for each of groups 2 and 3. This can be achieved by issuing a further two multicast transactions 535, 545 which are the same as the transaction 525, but specify different groups. In particular, the transaction 535 specifies group 2, and accordingly following the processing of that transaction, the data field 150 will indicate the passed status 540 since each of the memory units M1 and M2 passed the test. Similarly, the transaction 545 identifies group 3, and following the performance of that transaction the data field 150 will indicate the failed status 550, due to the fact that memory unit M5 failed the test.

At this point, the reason for the failure has been narrowed down to one of the memory units of group 3. It may be from experience that memory unit M5 is known to be problematic and therefore the most likely source of the failure in group 3. To test this theory, the user can set up a programmable group to include memory units M3 and M4, but to exclude memory unit M5. This can be achieved by the sequence of three transactions illustrated in FIG. 7E.

In particular, a first multicast transaction directed to group 1 causes the programmable group register 320 to be written with a logic zero value. Following the performance of this transaction, the programmable group register within each memory test circuit of each test module will identify that the associated memory unit is not part of the programmable group, as indicated by the sequence of crosses 557 in FIG. 7E. Thereafter, a second multicast transaction 560 can be issued in respect of group 3 to cause a logic one value to be written into the programmable group register of each memory test circuit associated with one of the memory units in group 3. Following the performance of this transaction, the programmable group registers within the memory test circuits associated with memory units M3, M4 and M5 will be set to indicate that those memory units are part of the programmable group, whilst the programmable group register of the memory test circuitry associated with memory units M1 and M2 will still retain their logic zero value to indicate that memory units M1 and M2 are not part of the programmable group. This status is summarised by the sequence of crosses and ticks 562 in FIG. 7E.

Finally, a third transaction can be issued, in this example the unicast transaction 565, which causes the programmable group register of the memory test circuitry associated with memory unit M5 to be written to a logic zero value, thereby removing memory unit M5 from the programmable group as indicated by the sequence of crosses and ticks 567 in FIG. 7E.

As then illustrated in FIG. 7F, a further multicast transaction can now be issued to cause a read operation to be performed in respect of the status register for the programmable group. This causes the status register associated with memory units M3 and M4 to be read, and following the performance of this transaction, it will be appreciated that the data field 150 will store the passed condition 575.

Accordingly, it will be appreciated from the above discussion that sequences of multicast and unicast transactions can be used in order to identify failure within a particular memory unit. The transactions may be directed initially to one or more predefined groups, and then as required programmable groups can be established to test particular theories about the likely cause of a test fail condition.

Figure 8:
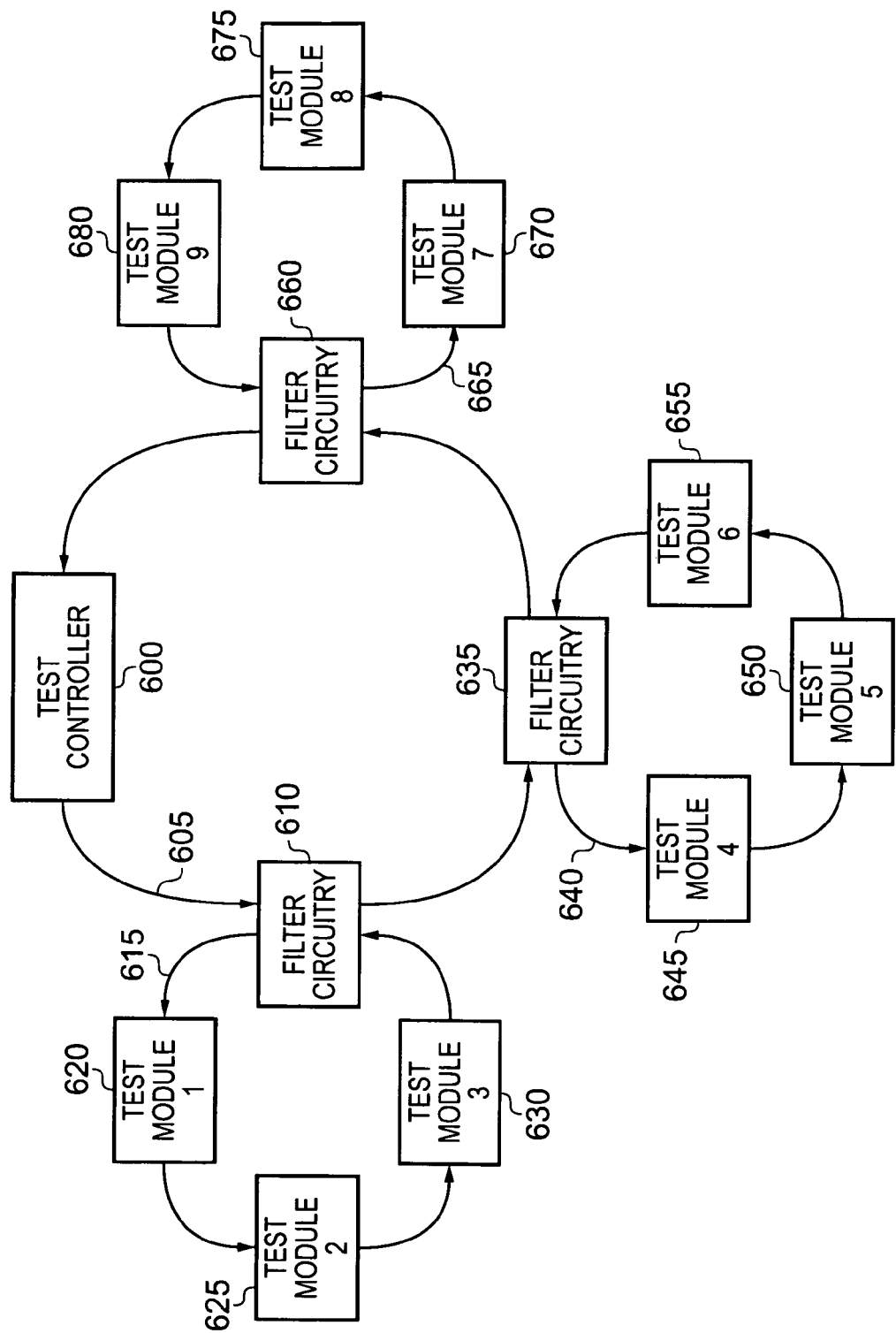
FIG. 8 illustrates an example of a ring bus implementation of one embodiment, where the ring bus is arranged as a number of sub-rings.

Whilst in the example of FIG. 1, it is assumed that each transaction issued by the test controller 55 passes through each test module 20, 30, 40 in turn, in an alternative embodiment the ring bus may be arranged as a number of sub-rings, as illustrated for example in FIG. 8. In particular, in this example, the ring bus consists of four sub-rings 605, 615, 640, 665. The test controller 600 is connected to a first sub-ring 605 which also includes filter circuitry 610, 635, 660. Each filter circuitry is associated with another sub-ring comprising a plurality of test modules, and accordingly the filter circuitry 610 is associated with the sub-ring 615 containing test modules 620, 625, 630, filter circuitry 635 is associated with the sub-ring 640 containing the test modules 645, 650, 655 and filter circuitry 660 is associated with the sub-ring 665 containing test modules 670, 675, 680. Through such an arrangement, it is possible in some instances to avoid each transaction being provided to every test module. In particular, the filter circuits maintain information about the memory units associated with the various test modules of the associated sub-ring. In particular, the filter circuitry maintains information about the memory ID of those memory units and the IDs of any groups that those memory units belong to. Accordingly, when a transaction is received by the filter circuitry as it is passed around the sub-ring 605, that filter circuitry can perform some initial decoding to check whether any of the test modules in the associated sub-ring will need to process the transaction, based on the memory ID or group ID information provided in the transaction.

Hence, by way of example, if the filter circuitry 610 determines for a unicast transaction that the memory ID specified by the transaction does not correspond to any of the memory units associated with the test modules 620, 625, 630 within the sub-ring 615, then it can determine that there is no need for that transaction to be passed through the sub-ring 615, and can instead pass the transaction straight on to the filter circuitry 635. Similarly, for a multicast transaction, if the filter circuitry 610 determines from the group ID specified in the multicast transaction that none of the memory units of the group are associated with any of the test modules 620, 625, 630, then again there is no need for the transaction to be routed around the sub-ring 615, and instead the transaction can be forwarded straight on to the filter circuitry 635.

The filter circuitry can be arranged in a variety of ways. However, in one embodiment it can be arranged in a similar manner to the decode circuitry 310 provided within each memory test circuitry 300, although in this instance it is provided within the memory IDs and group IDs relevant to all of the memory units associated with the memory test modules in its associated sub-ring.

Figure 9:
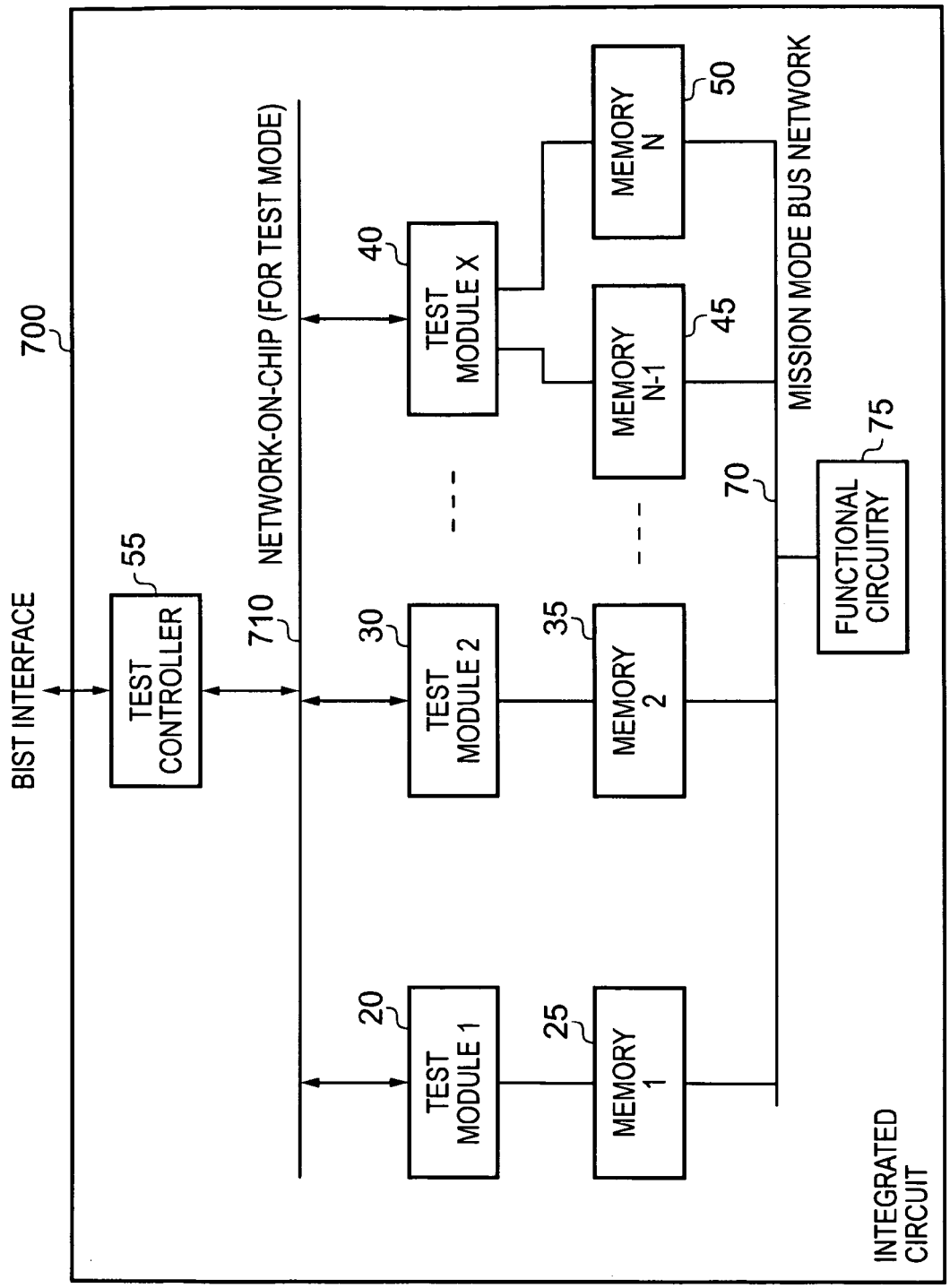
FIG. 9 is a block diagram of an integrated circuit in accordance with an alternative embodiment.

Whilst in FIG. 1, it is assumed that the test controller 55 communicates with the various test modules 20, 30, 40 via a ring bus in a serial manner, in an alternative embodiment as shown in FIG. 9, the ring bus can be replaced with a network-on-chip (NoC) 710, allowing the transactions to be routed in parallel to the various test modules 20, 30, 40.

Figure 10:
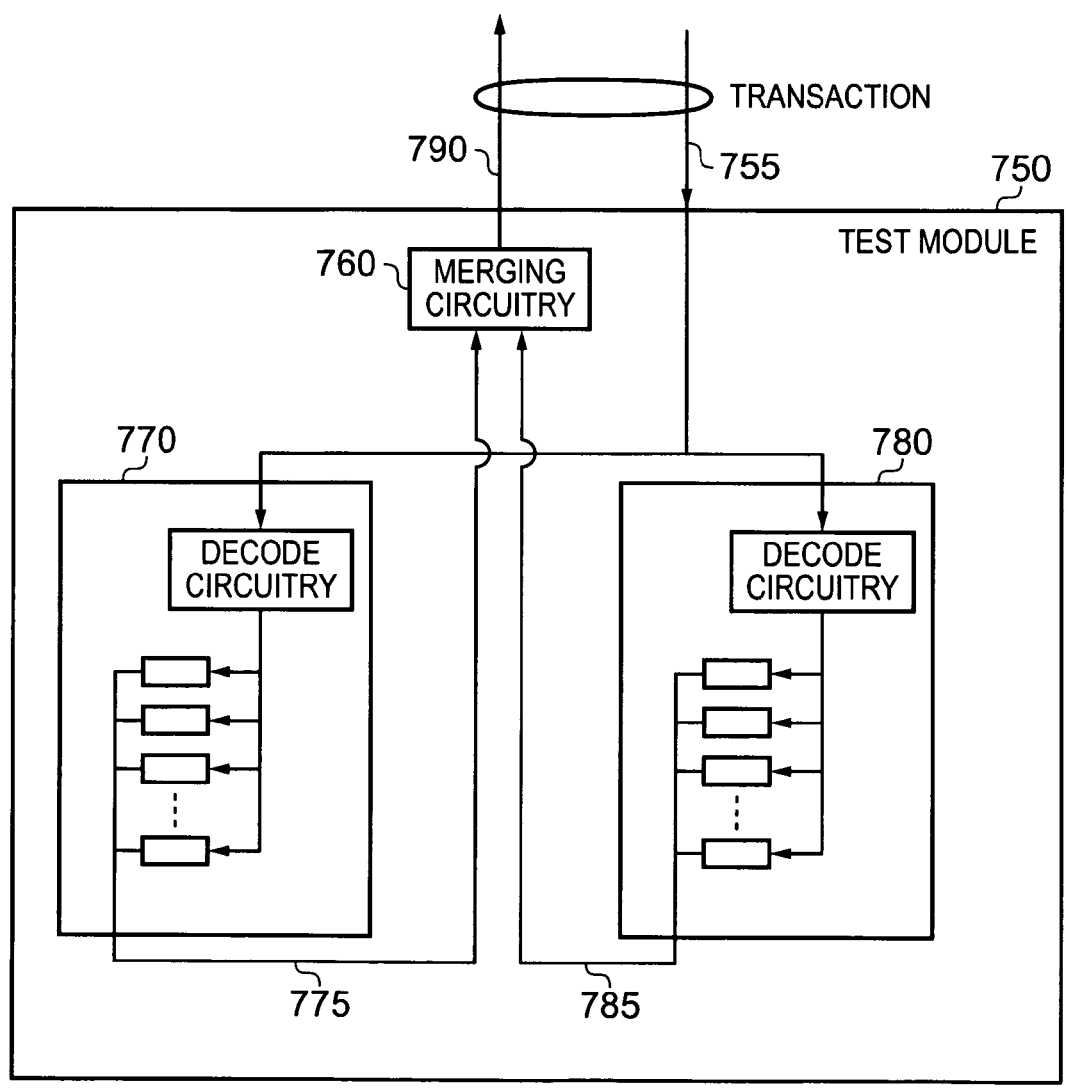
FIG. 10 is a diagram illustrating in more detail the construction of a test module that may be used within the integrated circuit of FIG. 9 in accordance with one embodiment.

FIG. 10 schematically illustrates a form of test module that may be used in accordance with the embodiment of FIG. 9. For consistency with the earlier described FIG. 3, it is assumed that the test module is associated with two memory units, and accordingly includes two memory test circuits. Hence, as illustrated in FIG. 10, the test module 750 has a first memory test circuit 770 and a second memory test circuit 780. These memory test circuits may be constructed identically to the memory test circuit 205, 220 of FIG. 3, and accordingly will not be discussed in more detail herein.

In one embodiment, the NoC 710 provides a multi-bit bus infrastructure allowing an entire transaction to be propagated in parallel to the various test modules, and accordingly there is no need for any serial to parallel conversion at the input interface of the test module, nor for any parallel to serial conversion at the output interface. Instead, a transaction can be routed over the input path 755 to the test module where it is provided directly to the decode circuitry of the memory test circuitry 770, 780.

To support multicast read transactions where multiple read operations may occur within the same test module, as for example would be the case with the illustrated test module of FIG. 10, the read data output over paths 775, 785 from the various memory test circuits 770, 780 can be routed to merging circuitry 760, where the read data can be merged together prior to output over path 790 back to the test controller 55. Hence, considering the earlier example of performing a multicast read of a status register, the merging circuitry can produce a merged output indicative of whether both memory units have passed a test or whether one or more of them has failed a test, assuming multiple memory units associated with the same test module are within the same group that is the subject of the read transaction.

Figure 11:
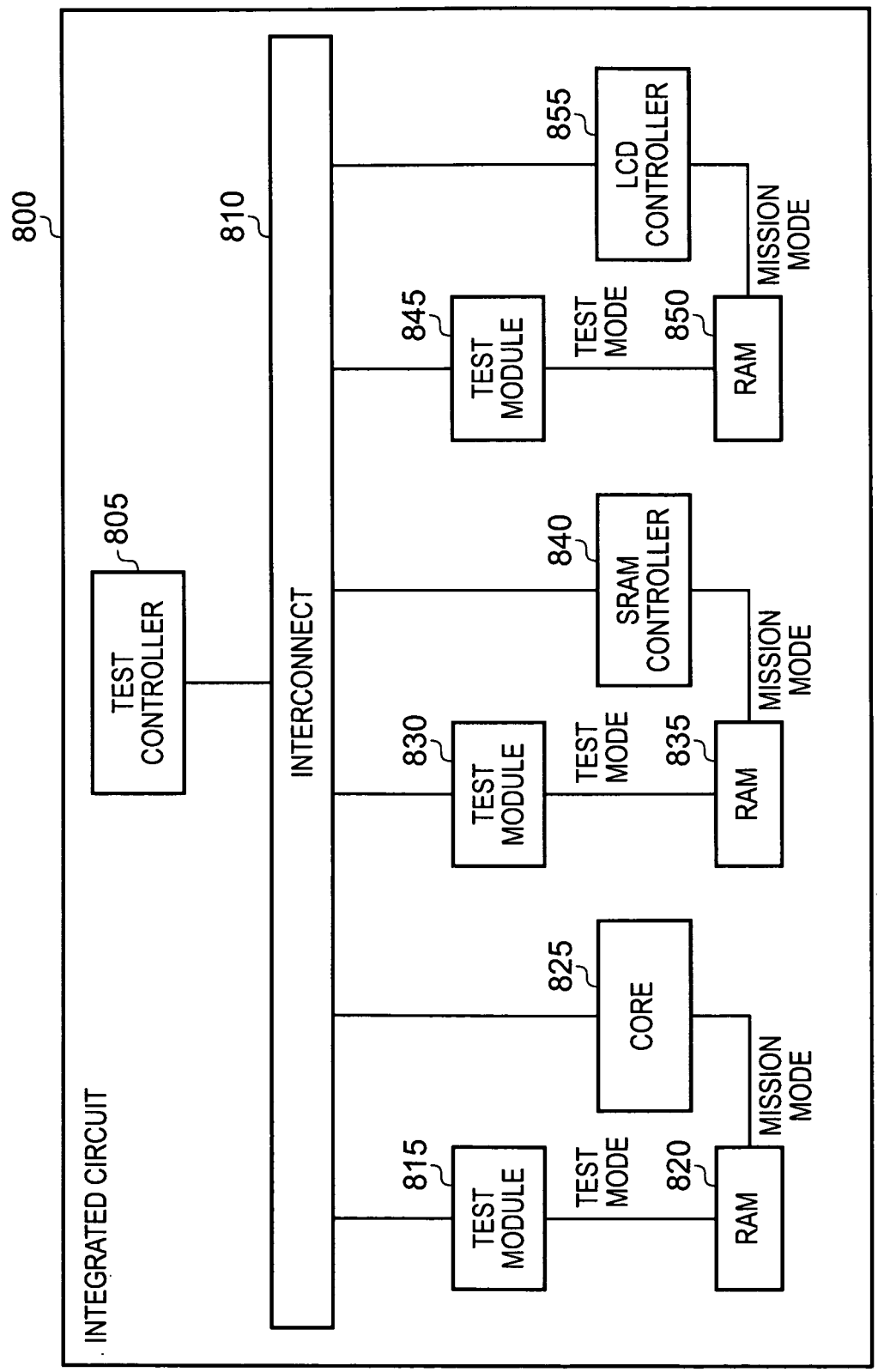
FIG. 11 is a block diagram of an integrated circuit in accordance with an alternative embodiment.

In FIG. 9, it is assumed that the NoC 710 provided for the test mode of operation is physically separate from the bus network 70 provided to allow the functional circuitry 75 to access the memory units in the mission mode of operation. However, in an alternative embodiment, both the NoC 710 and the mission mode bus network 70 may share at least partially the same physical structure. FIG. 11 provides an example of such an embodiment where an on-chip interconnect network 810 is used to implement both the NoC 710 and the mission mode bus network 70.

Considering FIG. 11 in more detail, the integrated circuit 800 has a test controller 805 connected via the interconnect 810 to various test modules 815, 830, 845, each test module having an associated memory unit, in this example the RAMs (Random Access Memories) 820, 835, 850. In the test mode of operation, these various RAMs 820, 835, 850 are subjected to one or more test operations by the associated test modules 815, 830, 845 in dependence on a series of transactions issued by the test controller 805.

In the mission mode of operation, i.e. the normal mode of operation, the memory units are not being tested, but instead are being used by functional circuits to store data for access by those functional circuits. Hence, by way of example, a processor core 825 may have access to the RAM 820, an SRAM controller 840 may have access to the RAM 835, and an LCD controller 855 may have access to the RAM 850. These various functional circuits 825, 840, 855 will communicate via the interconnect 810 in the mission mode of operation in order to implement the required functionality of the integrated circuit 800.

Figure 12:
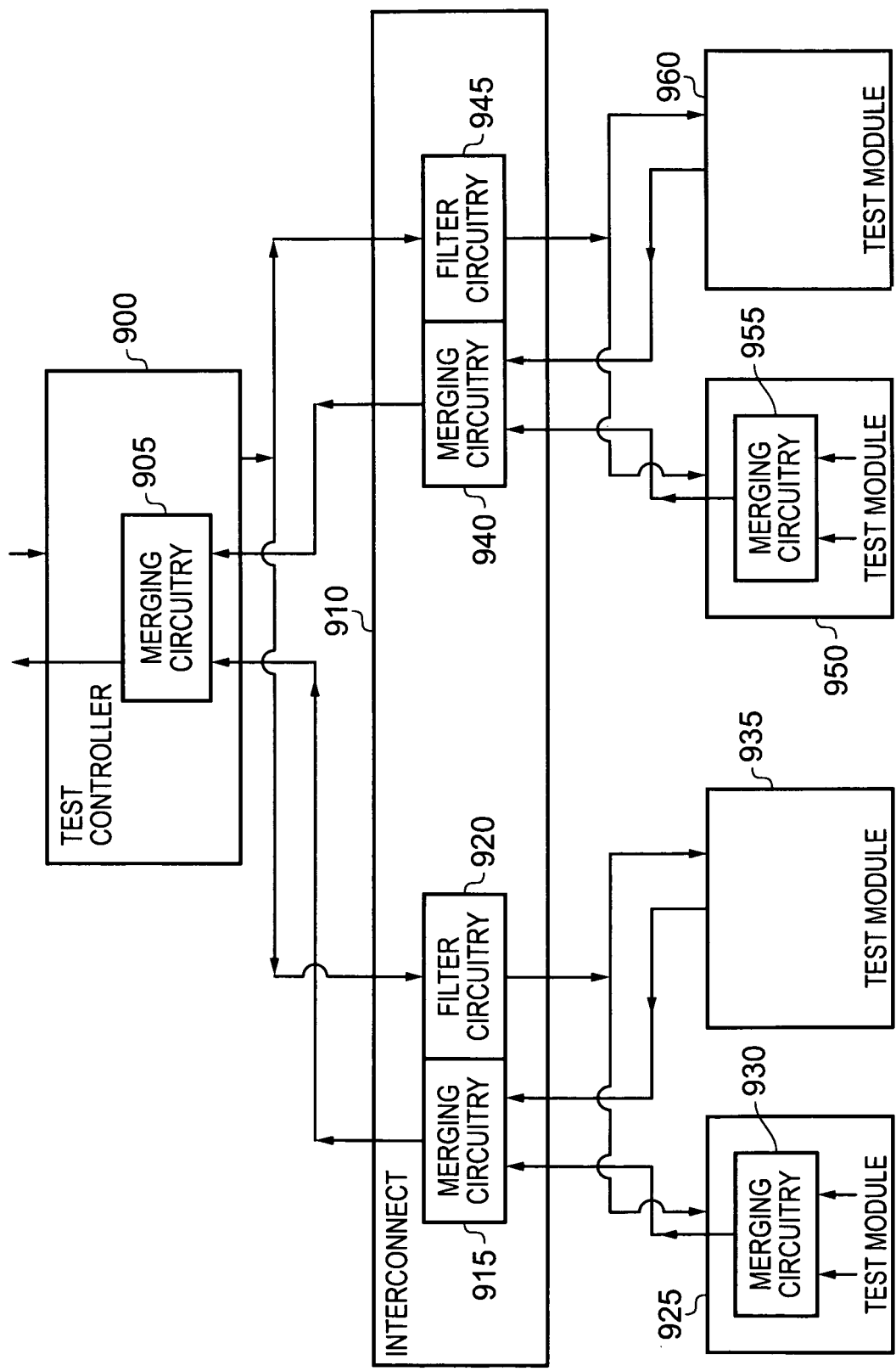
FIG. 12 is a diagram schematically illustrating the use of merging circuitry and filter circuitry in accordance with one embodiment.

FIG. 12 illustrates how merging circuits and filter circuits may be used when connecting a plurality of test modules in parallel with a test controller via a NoC such as illustrated in the embodiments of either FIG. 9 or 11. In the example of FIG. 12, it is assumed that an interconnect 910 is used to provide a connection between the test controller 900 and the plurality of test modules 925, 935, 950, 960. In this example, it is assumed that test modules 935, 960 are associated with only a single memory unit, and hence do not require the merging circuitry 760 such as shown in FIG. 10. However, the test modules 925, 950 are each associated with multiple memory units, and accordingly include merging circuits 930, 955, respectively.

Based on instructions received over the BIST interface, the test controller 900 will issue individual transactions to the interconnect 910. In this example, each transaction is intercepted by filter circuitry 920, 945 within the interconnect 910. In particular, the filter circuitry 920 is associated with the test modules 925, 935 and the filter circuitry 945 is associated with the test modules 950, 960. In a similar way to the filter circuitry described earlier with reference to FIG. 8, the filter circuitry determines from the memory ID or group ID specified in the transaction whether any of the associated test modules are connected to a memory unit that is the subject of the transaction, and if it is determined that at least one of the test modules is associated with such a memory unit, then the transaction is propagated on to the test modules. However, if not, the transaction is not passed on to the test modules, avoiding any need for the test modules to analyse the transaction. Instead, the filter circuitry 920, 945 can issue a dummy response back to the test controller 900 as required, for example to confirm that the transaction has been processed, or to provide default read data if required.

It will also be seen from FIG. 12 that merging circuitry can be provided at various hierarchical levels. For example, merging circuitry may be provided within test modules such as the test modules 925, 950, and additionally may be provided within the interconnect 910 to merge read data received from multiple test modules (as indicated by elements 915, 940). Similarly, merging circuitry 905 may be provided in the test controller 900 itself to merge read data passed back from the various merging circuits 915, 940 within the interconnect 910, so that a single merged result may be output via the BIST interface.

By arranging the test controller to issue transactions of the form described above, and providing each memory test module with decode circuitry that selectively performs a register access operation based on analysis of the transaction as described above with reference to the various embodiments, each transaction can be written without needing to know where the memory unit or memory units that are the subject of the transaction actually reside relative to other memory units within the integrated circuit. The transaction then merely needs to be provided to each memory test module (or at least to each memory test module that could be associated with a targeted memory unit for the transaction), and the decode circuitry within each memory test module will then perform the access if required.

Such an approach hence provides a very simple programmer's view of the memory test system, allowing any transactions to be targeted at any individual memory unit, or at arbitrary combinations of memory units as defined by the memory groups.

The memory groups can be established based on any suitable criteria, for example size of memory, memory compiler type, logical hierarchy, power down characteristics, size, memory IP vendor, bit cell type, power domain, frequency, physical location, ECC, parity, etc. Further, the memory groups can be established at compile time (i.e. when the MBIST RTL is generated) or at run time through the use of programmable groups, so that the memory groups can be created and modified by software.

The invention hence provides a simple mechanism for targeting specific memories during memory testing. The clean programmer's model that follows from the use of the above described embodiments allows more efficient test programs to be created that can also be made portable from one device to another. This is a significant advantage, as test patterns are currently time consuming to produce and are difficult to change. Through use of the above embodiments described, a fixed set of test program deliverables can be provided.

Although particular embodiments of the invention have been described herein, it will be apparent that the invention is not limited thereto, and that many modifications and additions may be made within the scope of the invention. For example, various combinations of the features of the following dependent claims could be made with the features of the independent claims without departing from the scope of the present invention.

I claim:

1. An integrated circuit comprising:
   a plurality of memory units;
   at least one memory test module, each memory test module having at least one associated memory unit from said plurality of memory units;
   each memory test module comprising:
      a set of test registers for each associated memory unit;
      a test engine is configured, for each associated memory unit, to perform a test operation on that associated memory unit dependent on the status of the set of test registers provided for that associated memory unit;
      a transaction interface for receiving a transaction specifying a register access operation, the transaction providing a first address portion and a second address portion, the first address portion having encodings allowing individual memory units to be identified and groups of memory units to be identified, and the second address portion identifying one of the test registers within said set to be an accessed register for the register access operation; and a decode circuitry is configured to selectively perform the register access operation in response to the transaction by:

(i) if an individual memory unit is identified by the first address portion, then determining whether that individual memory unit is one of said at least one associated memory units and, if so, performing the register access operation on the accessed register within the set of test registers provided for that individual memory unit; and (ii) if a group of memory units is identified by the first address portion, then determining whether any of said at least one associated memory units is a memory unit within said group, and, if so, performing the register access operation on the accessed register within the set of test registers provided for each associated memory unit within said group.

2. An integrated circuit as claimed in claim 1, wherein said first address portion comprises a type field and an identifier field, the type field identifying whether the transaction is a unicast transaction identifying an individual memory unit or a multicast transaction identifying a group of memory units, and the identifier field identifying the individual memory unit for a unicast transaction and identifying the group of memory units for a multicast transaction.

3. An integrated circuit as claimed in claim 1, wherein:
said transaction includes a data field for providing data;
said transaction identifies whether said register access operation is a read operation or a write operation, if the register access operation is a write operation the decode circuitry causes the data provided in the data field to be written into the accessed register of each set of test registers for which the decode circuitry determines the register access operation is to be performed.

4. An integrated circuit as claimed in claim 3, wherein:
if the register access operation is a read operation, the decode circuitry causes to be output in the data field the data read from the accessed register of each set of test registers for which the decode circuitry determines the register access operation is to be performed.

5. An integrated circuit as claimed in claim 4, further comprising:
merging circuitry, responsive to the transaction identifying one of said groups of memory units within the first address portion and the register access operation of that transaction being a read operation, to merge into the data field the data read from the accessed register within the set of test registers provided for each memory unit within said group.

6. An integrated circuit as claimed in claim 5, wherein the accessed register is a status register within the set of test registers, and the merging circuitry operates to establish within the data field a cumulative status for the group of memory units.

7. An integrated circuit as claimed in claim 1, wherein the memory units forming each group of memory units are predefined.

8. An integrated circuit as claimed in claim 1, wherein at least one of said groups of memory units is programmable.

9. An integrated circuit as claimed in claim 8, wherein each said set of test registers includes a programmable group register that is programmable by one of said transactions specifying the programmable group register in the second address portion to be the accessed register for a write operation, such that the value stored in the programmable group register indicates whether the memory unit for which the corresponding set of test register is provided is within the programmable group of memory units or not.

10. An integrated circuit as claimed in claim 9, wherein the transaction used to program the programmable group register specifies in the first address portion either an individual memory unit or a group of memory units.

11. An integrated circuit as claimed in claim 9, wherein multiple transactions are issued to program the required programmable group registers in order to identify the programmable group of memory units.

12. An integrated circuit as claimed in claim 1, further comprising:
a test controller for issuing said transaction; and
a communication structure for distributing said transaction to said at least one memory test module.

13. An integrated circuit as claimed in claim 12, wherein:
said at least one memory test module comprises a plurality of memory test modules, each memory test module associated with a different subset of said plurality of memory units.

14. An integrated circuit as claimed in claim 13, wherein:
said communication structure comprises a ring bus connecting said test controller and each of said memory test modules in series, such that the transaction is routed sequentially through each memory test module.

15. An integrated circuit as claimed in claim 14, wherein each memory test module comprises merging circuitry, responsive to the transaction identifying one of said groups of memory units within the first address portion and the register access operation of that transaction being a read operation, to merge into existing data within the data field any data read from the accessed register within its at least one set of test registers.

16. An integrated circuit as claimed in claim 14, wherein each memory test module employs a handshaking protocol to control propagation of the transaction around the ring bus.

17. An integrated circuit as claimed in claim 13, wherein:
said communication structure comprises a bus network via which the test controller is configured to broadcast the transaction in parallel to each of said memory test modules.

18. An integrated circuit as claimed in claim 17, wherein each memory test module that has a plurality of sets of test registers comprises merging circuitry, responsive to the transaction identifying one of said groups of memory units within the first address portion and the register access operation of that transaction being a read operation, to merge the data read from the accessed register within multiple sets of test registers within that memory test module.

19. An integrated circuit as claimed in claim 17, wherein the bus network includes at least one merging circuitry, responsive to the transaction identifying one of said groups of memory units within the first address portion and the register access operation of that transaction being a read operation, to merge the data read from the accessed register within the set of test registers provided within multiple memory test modules.

20. An integrated circuit as claimed in claim 17, wherein the bus network is further used by functional circuitry used to access memory addresses during a mission mode of operation.

21. An integrated circuit as claimed in claim 20, wherein the bus network is an interconnect circuit.

22. An integrated circuit as claimed in claim 13, wherein the communication structure includes filtering circuitry for filtering the transaction so that the transaction is provided to only a subset of the memory test modules.

23. An integrated circuit comprising:
a plurality of memory unit means;
at least one memory test means, each memory test means having at least one associated memory unit means from said plurality of memory unit means;
each memory test means comprising:
 a set of test register means for each associated memory unit means;
 test means for performing, for each associated memory unit means, a test operation on that associated memory unit means dependent on the status of the set of test register means provided for that associated memory unit means;
 transaction interface means for receiving a transaction specifying a register access operation, the transaction providing a first address portion and a second address portion, the first address portion having encodings allowing individual memory unit means to be identified and groups of memory unit means to be identified, and the second address portion identifying one of the test register means within said set to be an accessed register means for the register access operation; and
 decode means, responsive to the transaction, for selectively performing the register access operation by:
 (i) if an individual memory unit means is identified by the first address portion, then determining whether that individual memory unit means is one of said at least one associated memory unit means and, if so, performing the register access operation on the accessed register means within the set of test register means provided for that individual memory unit means; and
 (ii) if a group of memory unit means is identified by the first address portion, then determining whether any of said at least one associated memory unit means is a memory unit means within said group, and, if so, performing the register access operation on the accessed register means within the set of test register means provided for each associated memory unit means within said group.

24. A method of testing a plurality of memory units within an integrated circuit, said circuit comprising at least one memory test module, each memory test module having at least one associated memory unit from said plurality of memory units, and each memory test module comprising a set of test registers for each associated memory unit, the method comprising performing within each memory test module the steps of:
 performing a test operation on each memory unit associated with said memory test module dependent on the status of the set of test registers provided for said associated memory unit;
 receiving a transaction specifying a register access operation, the transaction providing a first address portion and a second address portion, the first address portion having encodings allowing individual memory units to be identified and groups of memory units to be identified, and the second address portion identifying one of the test registers within said set to be an accessed register for the register access operation; and
 responsive to the transaction, selectively performing the register access operation by:
 (i) if an individual memory unit is identified by the first address portion, then determining whether that individual memory unit is one of said at least one associated memory units and, if so, performing the register access operation on the accessed register within the set of test registers provided for that individual memory unit; and
 (ii) if a group of memory units is identified by the first address portion, then determining whether any of said at least one associated memory units is a memory unit within said group, and, if so, performing the register access operation on the accessed register within the set of test registers provided for each associated memory unit within said group.

* * * * *